United States Patent
Shishido et al.

(10) Patent No.: US 11,314,161 B2
(45) Date of Patent: Apr. 26, 2022

(54) MASK BLANK, PHASE SHIFT MASK, AND METHOD OF MANUFACTURING SEMICONDUCTOR DEVICE

(71) Applicant: HOYA CORPORATION, Tokyo (JP)

(72) Inventors: Hiroaki Shishido, Tokyo (JP); Kazutake Taniguchi, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 105 days.

(21) Appl. No.: 16/980,357

(22) PCT Filed: Feb. 20, 2019

(86) PCT No.: PCT/JP2019/006251
§ 371 (c)(1),
(2) Date: Sep. 11, 2020

(87) PCT Pub. No.: WO2019/176481
PCT Pub. Date: Sep. 19, 2019

(65) Prior Publication Data
US 2021/0048740 A1    Feb. 18, 2021

(30) Foreign Application Priority Data
Mar. 14, 2018  (JP) .............................. JP2018-046507

(51) Int. Cl.
G03F 1/32        (2012.01)
G03F 1/34        (2012.01)
H01L 21/033      (2006.01)

(52) U.S. Cl.
CPC .................. *G03F 1/32* (2013.01); *G03F 1/34* (2013.01); *H01L 21/0337* (2013.01)

(58) Field of Classification Search
None
See application file for complete search history.

(56) References Cited

U.S. PATENT DOCUMENTS 5,561,009 A    10/1996  Mohri et al.
6,764,792 B1    7/2004  Fujikawa et al.
(Continued)

FOREIGN PATENT DOCUMENTS

JP         3301556 B2    7/1993
JP      2001083687 A     3/2001
(Continued)

OTHER PUBLICATIONS

PCT/JP2019/006251, English translation of International Search Report dated May 17, 2019, 2 pages.

*Primary Examiner* — Roberts P Culbert
(74) *Attorney, Agent, or Firm* — Kilpatrick Townsend & Stockton LLP

(57) ABSTRACT

Provided is a mask blank for a phase shift mask including an etching stopper film. The mask blank has a structure where a transparent substrate has stacked thereon an etching stopper film and a phase shift film in this order, in which the phase shift film contains silicon and oxygen, in which the phase shift film has a refractive index $n_1$ of 1.5 or more for light of 193 nm wavelength and an extinction coefficient $k_1$ of 0.1 or less for light of 193 nm wavelength, in which the etching stopper film has a refractive index $n_2$ of 2.5 or more and 3.1 or less for light of 193 nm wavelength and an extinction coefficient $k_2$ of 0.4 or less for light of 193 nm wavelength, and the refractive index $n_2$ and the extinction coefficient $k_2$ satisfy at least one of a set of specified conditions.

50 Claims, 5 Drawing Sheets

(56) References Cited

U.S. PATENT DOCUMENTS

2018/0149961 A1    5/2018  Nozawa et al.
2019/0004420 A1*   1/2019  Ozawa ..................... G03F 1/54

FOREIGN PATENT DOCUMENTS

| JP | 2007241136 A | 9/2007 |
| JP | 2017134424 A | 8/2017 |
| JP | 2017223890 A | 12/2017 |

* cited by examiner

[FIG. 1]
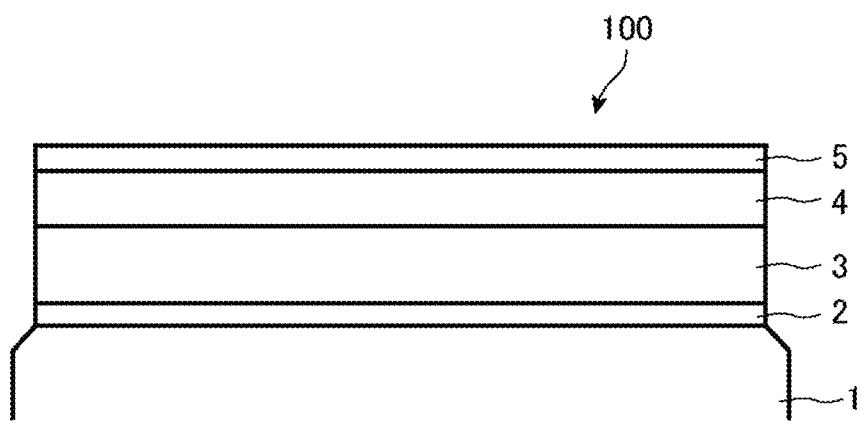
[FIG. 2]
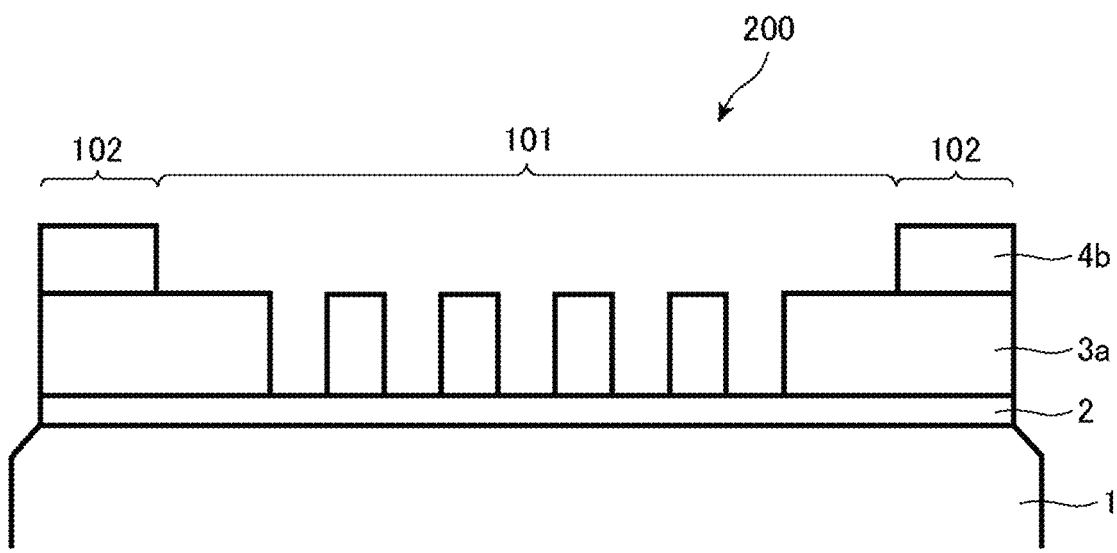

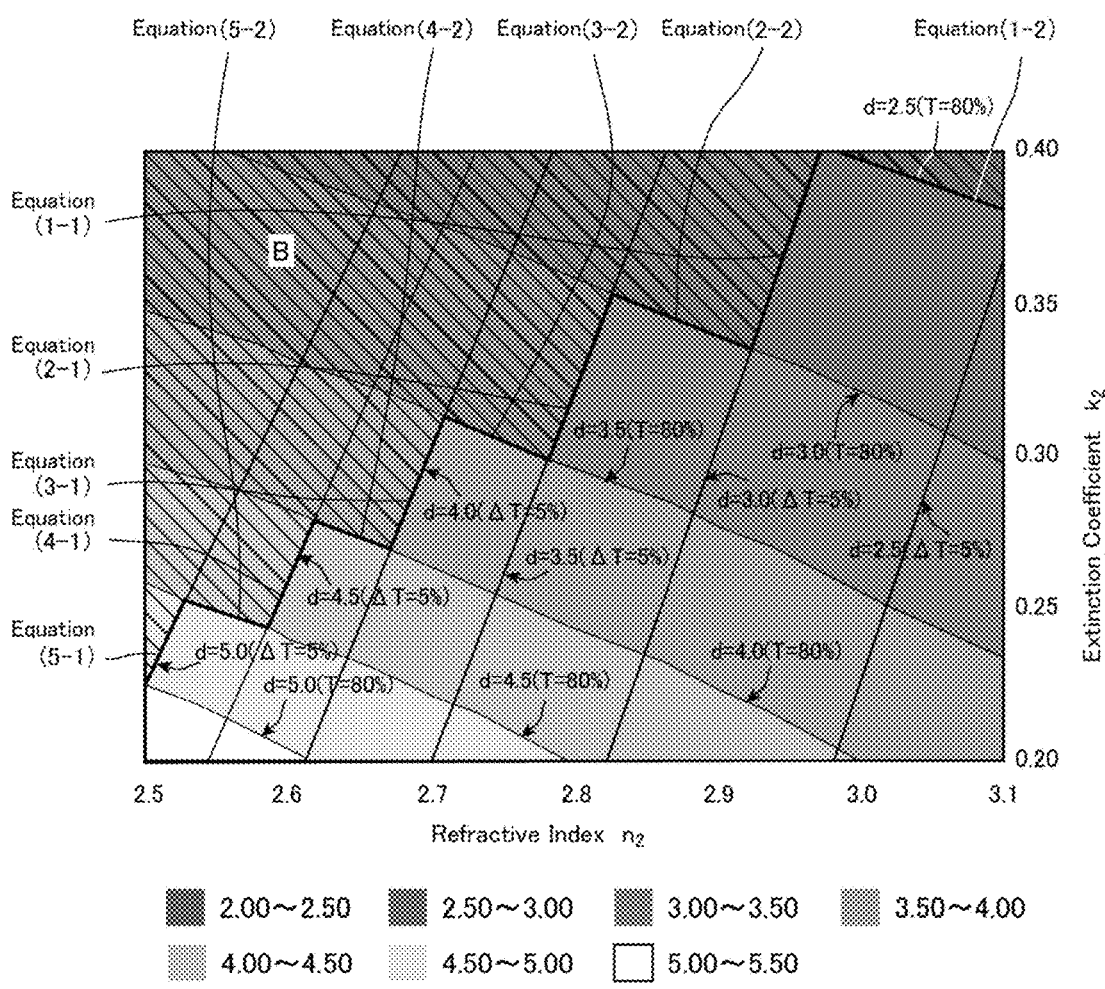
[FIG. 4]

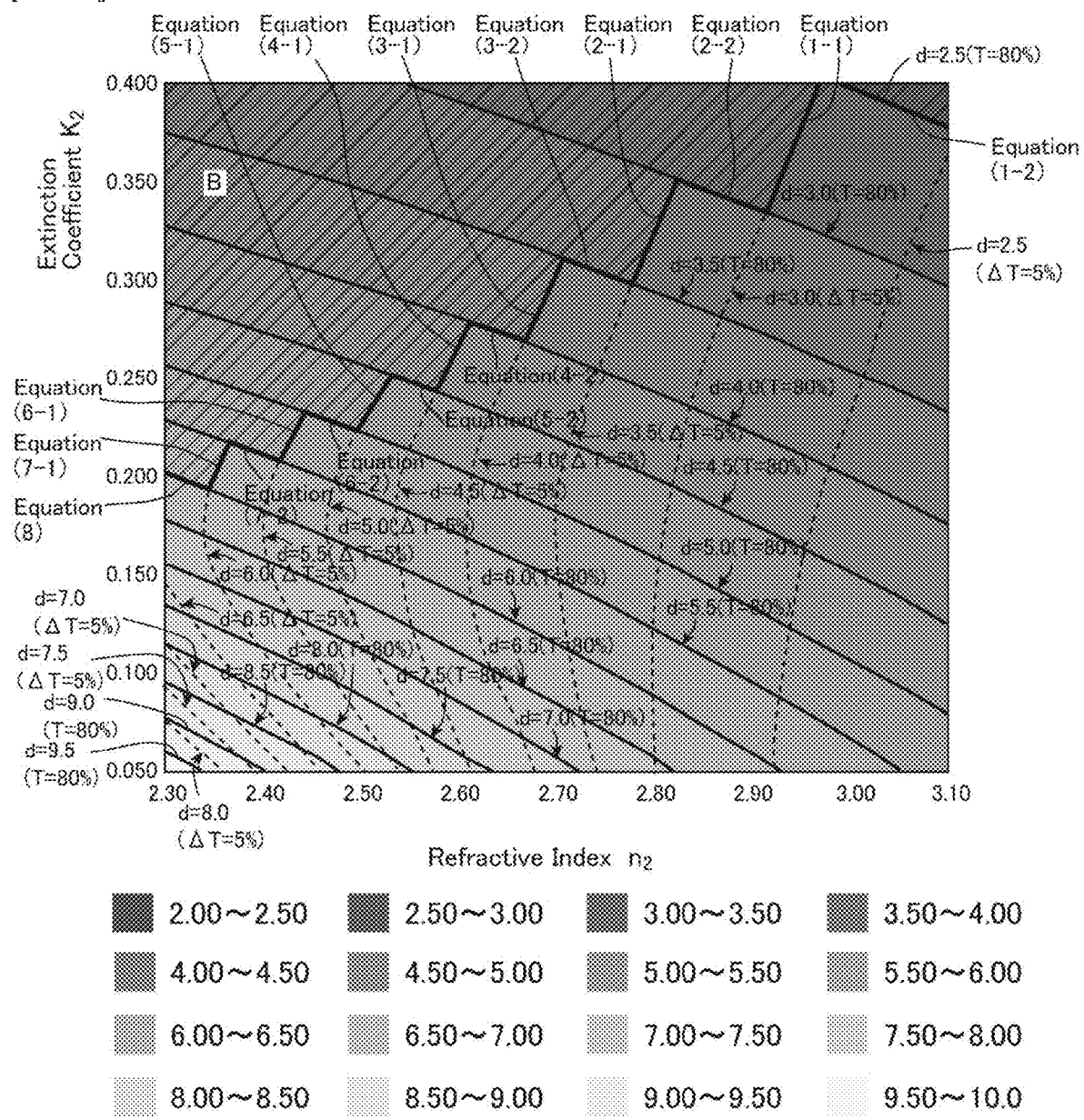

[FIG. 6]
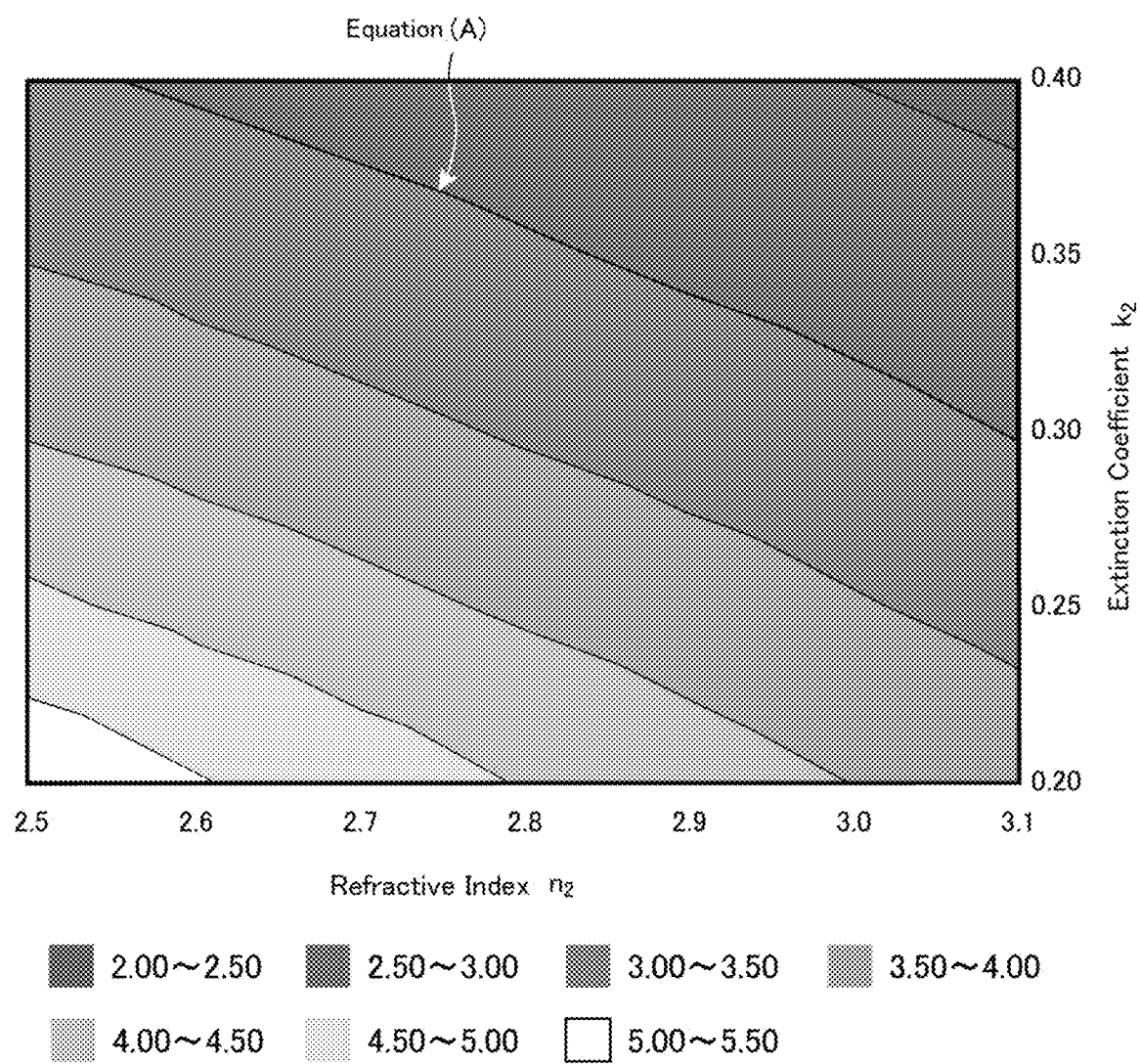

MASK BLANK, PHASE SHIFT MASK, AND METHOD OF MANUFACTURING SEMICONDUCTOR DEVICE

CROSS-REFERENCE TO RELATED APPLICATIONS

This application is a National Stage of International Application No. PCT/JP2019/006251, filed Feb. 20, 2019, which claims priority to Japanese Patent Application No. 2018-046507, filed Mar. 14, 2018, and the contents of which is incorporated by reference.

TECHNICAL FIELD

This disclosure relates to a mask blank and a phase shift mask manufactured using the mask blank. This disclosure further relates to a method of manufacturing a semiconductor device using the phase shift mask.

BACKGROUND ART

Generally, in a manufacturing process of a semiconductor device, photolithography is used to form a fine pattern. In forming this pattern, multiple transfer masks are usually used; and particularly in forming a fine pattern, a phase shift mask with an enhanced transfer performance, mainly resolution, by using phase difference of light is often used. Further, in order to miniaturize a pattern of a semiconductor device, in addition to improvement of a transfer mask represented by a phase shift mask, it is necessary to shorten a wavelength of an exposure light source used in photolithography. Thus, shortening of wavelength has been advancing recently from the use of KrF excimer laser (wavelength 248 nm) to ArF excimer laser (wavelength 193 nm) as an exposure light source used in the manufacture of a semiconductor device.

The types of these mask blanks for a phase shift mask include a shifter overlaid Levenson type, a shifter underlying Levenson type, a half tone type, etc. For example, Patent Document 1 discloses a shifter overlaid Levenson type mask blank. This mask blank has an etching stopper layer between a transparent substrate and a phase shifter layer for dry-etching the phase shifter layer provided on the transparent substrate. This etching stopper layer is made of a layer including hafnium oxide.

Further, Patent Document 2 discloses a mask blank for a chromeless phase shift mask, in which a substrate that is transparent to an exposure light is provided with a dug-down portion to control the phase of a transmitting light. A light shielding film provided in a part adjacent to the dug-down portion of the substrate or in the peripheral part of the substrate includes a film A being composed of a material which can be etched in an etching process using etching gas mainly including fluorine-based gas.

PRIOR ART PUBLICATIONS

Patent Documents

[Patent Document 1]
Japan Patent No. 3301556
[Patent Document 2]
Japanese Patent Application Publication 2007-241136

SUMMARY OF THE INVENTION

Problems to be Solved by the Invention

In the case of a chromeless phase shift mask in which a substrate itself transparent to an exposure light is provided with a dug-down portion as described in Patent Document 2, each dug-down portion of the phase shift mask is simultaneously formed by dry-etching the substrate. In the conventional dry etching in which a dug-down portion is formed in a transparent substrate, it is difficult to detect an etching end point unlike the case where a phase shift film provided on a transparent substrate is patterned by etching. Even if a bottom shape and depth of a pattern of each dug-down portion in a phase shift mask are controlled by the etching time, they are affected by a micro-trench phenomenon, a micro-loading phenomenon, etc. Therefore, it is not easy to control a bottom shape and depth of each dug-down portion by dry etching.

On the other hand, an investigation is being made on a mask blank for a chromeless phase shift mask with a configuration where an etching stopper film is provided on a substrate, and a phase shift film being composed of silicon and oxygen and having substantially the same transmittance as that of a transparent substrate is provided on the etching stopper film. When a phase shift mask is manufactured, this mask blank is desired to generate a phase shifting effect between an exposure light that passes through a portion of the etching stopper film where the phase shift film exists (non-dug-down portion) and an exposure light that passes through a portion of the etching stopper film where the phase shift film does not exist (dug-down portion).

In the case of a chromeless phase shift mask, generation of a high phase shifting effect is desired since an exposure light pattern is formed only by the phase shifting effect that generates between an exposure light that passed through the non-dug-down portion and an exposure light that passed through the dug-down portion. Therefore, it is desired that the etching stopper film has a transmittance of 80% or more with respect to an ArF exposure light in a stacked structure of the etching stopper film and a phase shift film formed thereon.

The etching stopper film is left in both the patterned portion (dug-down portion) and the unpatterned portion (non-dug-down portion) of the transparent portion of the phase shift film. Decrease in transmittance of an exposure light in the transparent portion of the phase shift mask leads to decrease in an integrated amount of irradiation of an exposure light to a transfer object per unit time. Therefore, it is necessary to increase the exposure time, which leads to decrease in throughput of an exposure transfer step in a manufacture of a semiconductor device. From this viewpoint, the etching stopper film is desired to have a transmittance of 80% or more with respect to an ArF exposure light in a stacked structure with the phase shift film formed thereon.

The etching stopper film used in the phase shift photomask blank described in Patent Document 1 has a transmittance at an i-line (365 nm) of a mercury lamp having a relatively long wavelength and at a wavelength (248 nm) of a KrF excimer laser. However, the transmittance was insufficient in a wavelength of an ArF excimer laser used for forming a finer pattern.

Further, a resist film used for forming a transfer pattern on a wafer has a threshold of irradiation dose (dose) of an exposure light to expose. To form a fine pattern in a resist film on a wafer, it is preferable that the difference between a design line width of a pattern to be transferred on the resist film and a width of irradiation of a pattern where an irradiation dose of an exposure light exposed on the resist film when an exposure transfer is actually made using a phase shift mask exceeds the threshold is within a predetermined range. However, in exposing a wafer using a phase shift mask having a high transmittance such as a chromeless phase shift mask, it is difficult to adjust the design line width and the irradiation width of a pattern exceeding the threshold, when the difference is small between a transmittance of a dug-down portion and a transmittance of a non-dug-down portion (hereafter "transmittance difference between a dug-down portion and a non-dug-down portion"; or simply "transmittance difference") in a transparent portion of the phase shift film. Particularly in writing a fine pattern, it will be difficult to form a clear pattern on a resist surface. In view of forming a fine pattern in a wafer, it is preferable that a transmittance difference in a transparent portion is 5% or more.

Means for Solving the Problem

For solving the above problem, this disclosure includes the following configurations.
(Configuration 1)
A mask blank having a structure where a transparent substrate has stacked thereon an etching stopper film and a phase shift film in this order,
in which the phase shift film is made of a material containing silicon and oxygen,
in which the phase shift film has a refractive index $n_1$ of 1.5 or more to a light of 193 nm wavelength and an extinction coefficient $k_1$ of 0.1 or less to a light of 193 nm wavelength, and
in which the etching stopper film has a refractive index $n_2$ of 2.5 or more and 3.1 or less to a light of 193 nm wavelength and an extinction coefficient $k_2$ of 0.4 or less to a light of 193 nm wavelength, and the refractive index $n_2$ and the extinction coefficient $k_2$ satisfy one or more of (Condition 1) to (Condition 5):

$k_2 \leq 1.333 \times n_2 - 3.564$ and $k_2 \leq -0.200 \times n_2 + 0.998$ (Condition 1)

$k_2 \leq 1.212 \times n_2 - 3.073$ and $k_2 \leq -0.174 \times n_2 + 0.841$ (Condition 2)

$k_2 \leq 1.143 \times n_2 - 2.783$ and $k_2 \leq -0.194 \times n_2 + 0.839$ (Condition 3)

$k_2 \leq 1.070 \times n_2 - 2.520$ and $k_2 \leq -0.182 \times n_2 + 0.755$ (Condition 4)

$k_2 \leq 0.978 \times n_2 - 2.220$ and $k_2 \leq -0.154 \times n_2 + 0.640$ (Condition 5)

(Configuration 2)
A mask blank having a structure where a transparent substrate has stacked thereon an etching stopper film and a phase shift film in this order,
in which the phase shift film is made of a material containing silicon and oxygen,
in which the phase shift film has a refractive index $n_1$ of 1.5 or more to a light of 193 nm wavelength and an extinction coefficient $k_1$ of 0.1 or less to a light of 193 nm wavelength, and
in which the etching stopper film has a refractive index $n_2$ of 2.3 or more and 3.1 or less to a light of 193 nm wavelength and an extinction coefficient $k_2$ of 0.4 or less to a light of 193 nm wavelength, and the refractive index $n_2$ and the extinction coefficient $k_2$ satisfy one or more of (Condition 1) to (Condition 8):

$k_2 \leq 1.333 \times n_2 - 3.564$ and $k_2 \leq -0.200 \times n_2 + 0.998$ (Condition 1)

$k_2 \leq 1.212 \times n_2 - 3.073$ and $k_2 \leq -0.174 \times n_2 + 0.841$ (Condition 2)

$k_2 \leq 1.143 \times n_2 - 2.783$ and $k_2 \leq -0.194 \times n_2 + 0.839$ (Condition 3)

$k_2 \leq 1.070 \times n_2 - 2.520$ and $k_2 \leq -0.182 \times n_2 + 0.755$ (Condition 4)

$k_2 \leq 0.978 \times n_2 - 2.220$ and $k_2 \leq -0.154 \times n_2 + 0.640$ (Condition 5)

$k_2 \leq 0.899 \times n_2 - 1.964$ and $k_2 \leq -0.138 \times n_2 + 0.569$ (Condition 6)

$k_2 \leq 1.133 \times n_2 - 2.462$ and $k_2 \leq -0.186 \times n_2 + 0.657$ (Condition 7)

$k_2 \leq -0.201 \times n_2 + 0.665$ (Condition 8)

(Configuration 3)
The mask blank according to Configuration 1 or 2, in which the etching stopper film has the extinction coefficient $k_2$ of 0.05 or more.
(Configuration 4)
The mask blank according to any of Configurations 1 to 3, in which the phase shift film has the refractive index $n_1$ of 1.6 or less.
(Configuration 5)
The mask blank according to any of Configurations 1 to 4, in which the transparent substrate has a refractive index $n_3$ of 1.5 or more and 1.6 or less to a light of 193 nm wavelength, and an extinction coefficient $k_3$ of 0.1 or less to a light of 193 nm wavelength.
(Configuration 6)
The mask blank according to any of Configurations 1 to 5, in which a stacked structure of the etching stopper film and the phase shift film has a transmittance of 80% or more to a light of 193 nm wavelength.
(Configuration 7)
The mask blank according to any of Configurations 1 to 6, in which a difference between a transmittance of a stacked structure of the etching stopper film and the phase shift film to a light of 193 nm wavelength and a transmittance of the etching stopper film alone to a light of 193 nm wavelength is 5% or more.
(Configuration 8)
The mask blank according to any of Configurations 1 to 7, in which the etching stopper film is made of a material containing hafnium and oxygen.
(Configuration 9)
The mask blank according to any of Configurations 1 to 8, in which the etching stopper film is formed in contact with a main surface of the transparent substrate.
(Configuration 10)
The mask blank according to any of Configurations 1 to 9, in which the etching stopper film has a thickness of 2 nm or more and 10 nm or less.
(Configuration 11)
The mask blank according to any of Configurations 1 to 10, in which the phase shift film has a function to generate a phase difference of 150 degrees or more and 210 degrees or less between a light of 193 nm wavelength that transmitted through the phase shift film and a light of 193 nm wavelength that transmitted through the air for a same distance as a thickness of the phase shift film.
(Configuration 12)
The mask blank according to any of Configurations 1 to 11 including a light shielding film on the phase shift film.
(Configuration 13)
The mask blank according to Configuration 12, in which the light shielding film is made of a material containing chromium.

(Configuration 14)

A phase shift mask having a structure where a transparent substrate has stacked thereon an etching stopper film and a phase shift film having a phase shift pattern in this order, in which the phase shift film is made of a material containing silicon and oxygen, in which the phase shift film has a refractive index $n_1$ of 1.5 or more to a light of 193 nm wavelength and an extinction coefficient $k_1$ of 0.1 or less to a light of 193 nm wavelength, and in which the etching stopper film has a refractive index $n_2$ of 2.5 or more and 3.1 or less to a light of 193 nm wavelength and an extinction coefficient $k_2$ of 0.4 or less to a light of 193 nm wavelength, and the refractive index $n_2$ and the extinction coefficient $k_2$ satisfy one or more of (Condition 1) to (Condition 5):

$$k_2 \leq 1.333 \times n_2 - 3.564 \text{ and } k_2 \leq -0.200 \times n_2 + 0.998 \quad \text{(Condition 1)}$$

$$k_2 \leq 1.212 \times n_2 - 3.073 \text{ and } k_2 \leq -0.174 \times n_2 + 0.841 \quad \text{(Condition 2)}$$

$$k_2 \leq 1.143 \times n_2 - 2.783 \text{ and } k_2 \leq -0.194 \times n_2 + 0.839 \quad \text{(Condition 3)}$$

$$k_2 \leq 1.070 \times n_2 - 2.520 \text{ and } k_2 \leq -0.182 \times n_2 + 0.755 \quad \text{(Condition 4)}$$

$$k_2 \leq 0.978 \times n_2 - 2.220 \text{ and } k_2 \leq -0.154 \times n_2 + 0.640 \quad \text{(Condition 5)}$$

(Configuration 15)

A phase shift mask having a structure where a transparent substrate has stacked thereon an etching stopper film and a phase shift film having a phase shift pattern in this order, in which the phase shift film is made of a material containing silicon and oxygen, in which the phase shift film has a refractive index $n_1$ of 1.5 or more to a light of 193 nm wavelength and an extinction coefficient $k_1$ of 0.1 or less to a light of 193 nm wavelength, and in which the etching stopper film has a refractive index $n_2$ of 2.3 or more and 3.1 or less to a light of 193 nm wavelength and an extinction coefficient $k_2$ of 0.4 or less to a light of 193 nm wavelength, and the refractive index $n_2$ and the extinction coefficient $k_2$ satisfy one or more of (Condition 1) to (Condition 8):

$$k_2 \leq 1.333 \times n_2 - 3.564 \text{ and } k_2 \leq -0.200 \times n_2 + 0.998 \quad \text{(Condition 1)}$$

$$k_2 \leq 1.212 \times n_2 - 3.073 \text{ and } k_2 \leq -0.174 \times n_2 + 0.841 \quad \text{(Condition 2)}$$

$$k_2 \leq 1.143 \times n_2 - 2.783 \text{ and } k_2 \leq -0.194 \times n_2 + 0.839 \quad \text{(Condition 3)}$$

$$k_2 \leq 1.070 \times n_2 - 2.520 \text{ and } k_2 \leq -0.182 \times n_2 + 0.755 \quad \text{(Condition 4)}$$

$$k_2 \leq 0.978 \times n_2 - 2.220 \text{ and } k_2 \leq -0.154 \times n_2 + 0.640 \quad \text{(Condition 5)}$$

$$k_2 \leq 0.899 \times n_2 - 1.964 \text{ and } k_2 \leq -0.138 \times n_2 + 0.569 \quad \text{(Condition 6)}$$

$$k_2 \leq 1.133 \times n_2 - 2.462 \text{ and } k_2 \leq -0.186 \times n_2 + 0.657 \quad \text{(Condition 7)}$$

$$k_2 \leq -0.201 \times n_2 + 0.665 \quad \text{(Condition 8)}$$

(Configuration 16)

The phase shift mask according to Configuration 14 or 15, in which the etching stopper film has the extinction coefficient $k_2$ of 0.05 or more.

(Configuration 17)

The phase shift mask according to any of Configurations 14 to 16, in which the phase shift film has the refractive index $n_1$ of 1.6 or less.

(Configuration 18)

The phase shift mask according to any of Configurations 14 to 17, in which the transparent substrate has a refractive index $n_3$ of 1.5 or more and 1.6 or less to a light of 193 nm wavelength, and an extinction coefficient $k_3$ of 0.1 or less to a light of 193 nm wavelength.

(Configuration 19)

The phase shift mask according to any of Configurations 14 to 18, in which a stacked structure of the etching stopper film and the phase shift film has a transmittance of 80% or more to a light of 193 nm wavelength.

(Configuration 20)

The phase shift mask according to any of Configurations 14 to 19, in which a difference between a transmittance of a stacked structure of the etching stopper film and the phase shift film to a light of 193 nm wavelength and a transmittance of the etching stopper film alone to a light of 193 nm wavelength is 5% or more.

(Configuration 21)

The phase shift mask according to any of Configurations 14 to 20, in which the etching stopper film is made of a material containing hafnium and oxygen.

(Configuration 22)

The phase shift mask according to any of Configurations 14 to 21, in which the etching stopper film is formed in contact with a main surface of the transparent substrate.

(Configuration 23)

The phase shift mask according to any of Configurations 14 to 22, in which the etching stopper film has a thickness of 2 nm or more and 10 nm or less.

(Configuration 24)

The phase shift mask according to any of Configurations 14 to 23, in which the phase shift film has a function to generate a phase difference of 150 degrees or more and 210 degrees or less between a light of 193 nm wavelength that transmitted through the phase shift film and a light of 193 nm wavelength that transmitted through the air for a same distance as a thickness of the phase shift film.

(Configuration 25)

The phase shift mask according to any of Configurations 14 to 24 including a light shielding film having a light shielding pattern with a light shielding band on the phase shift film.

(Configuration 26)

The phase shift mask according to Configuration 25, in which the light shielding film is made of a material containing chromium.

(Configuration 27)

A method of manufacturing a semiconductor device including the step of using the phase shift mask according to any of Configurations 14 to 26 and exposure-transferring a pattern on the phase shift mask in a resist film on a semiconductor substrate.

(Configuration A1)

A mask blank having a structure where a transparent substrate has stacked thereon an etching stopper film and a phase shift film in this order, in which the phase shift film is made of a material containing silicon and oxygen, in which the etching stopper film is made of a material containing hafnium and oxygen, and in which a refractive index $n_2$ and an extinction coefficient $k_2$ of the etching stopper film satisfy (Condition A).

$$k_2 \leq -0.059 \times n_2^2 + 0.148 \times n_2 + 0.404 \quad \text{(Condition A)}$$

(Configuration A2)

The mask blank according to Configuration A1, in which the etching stopper film has a refractive index $n_2$ of 2.5 or more and 3.1 or less to a light of 193 nm wavelength, and an extinction coefficient $k_2$ of 0.2 or more and 0.4 or less to a light of 193 nm wavelength.
(Configuration A3)

A phase shift mask having a structure where a transparent substrate has stacked thereon an etching stopper film and a phase shift film having a phase shift pattern in this order, in which the phase shift film is made of a material containing silicon and oxygen, in which the etching stopper film is made of a material containing hafnium and oxygen, and in which a refractive index $n_2$ and an extinction coefficient $k_2$ of the etching stopper film satisfy (Condition A).
(Configuration A4)

The mask blank according to Configuration A3, in which the etching stopper film has a refractive index $n_2$ of 2.5 or more and 3.1 or less to a light of 193 nm wavelength, and an extinction coefficient $k_2$ of 0.2 or more and 0.4 or less to a light of 193 nm wavelength.
(Configuration A5)

A method of manufacturing a semiconductor device including the step of using the phase shift mask of Configuration A3 or A4 and exposure-transferring a pattern on the phase shift mask in a resist film on a semiconductor substrate.

Effect of the Invention

The mask blank of this disclosure has a structure where a transparent substrate has stacked thereon an etching stopper film and a phase shift film in this order, in which the phase shift film is composed of a material containing silicon and oxygen, in which the phase shift film has a refractive index $n_1$ of 1.5 or more to a light of 193 nm wavelength and an extinction coefficient $k_1$ of 0.1 or less to a light of 193 nm wavelength, in which the etching stopper film has a refractive index $n_2$ of 2.5 or more and 3.1 or less to a light of 193 nm wavelength and an extinction coefficient $k_2$ of 0.4 or less to a light of 193 nm wavelength, and the refractive index $n_2$ and the extinction coefficient $k_2$ satisfy one or more of (Condition 1) to (Condition 5).

$k_2 \leq 1.333 \times n_2 - 3.564$ and $k_2 \leq -0.200 \times n_2 + 0.998$ (Condition 1)

$k_2 \leq 1.212 \times n_2 - 3.073$ and $k_2 \leq -0.174 \times n_2 + 0.841$ (Condition 2)

$k_2 \leq 1.143 \times n_2 - 2.783$ and $k_2 \leq -0.194 \times n_2 + 0.839$ (Condition 3)

$k_2 \leq 1.070 \times n_2 - 2.520$ and $k_2 \leq -0.182 \times n_2 + 0.755$ (Condition 4)

$k_2 \leq 0.978 \times n_2 - 2.220$ and $k_2 \leq -0.154 \times n_2 + 0.640$ (Condition 5)

The mask blank of this disclosure has a structure where a transparent substrate has stacked thereon an etching stopper film and a phase shift film in this order, in which the phase shift film is composed of a material containing silicon and oxygen, in which the phase shift film has a refractive index $n_1$ of 1.5 or more to a light of 193 nm wavelength and an extinction coefficient $k_1$ of 0.1 or less to a light of 193 nm wavelength, in which the etching stopper film has a refractive index $n_2$ of 2.3 or more and 3.1 or less to a light of 193 nm wavelength and an extinction coefficient $k_2$ of 0.4 or less to a light of 193 nm wavelength, and the refractive index $n_2$ and the extinction coefficient $k_2$ satisfy one or more of (Condition 1) to (Condition 8).

$k_2 \leq 1.333 \times n_2 - 3.564$ and $k_2 \leq -0.200 \times n_2 + 0.998$ (Condition 1)

$k_2 \leq 1.212 \times n_2 - 3.073$ and $k_2 \leq -0.174 \times n_2 + 0.841$ (Condition 2)

$k_2 \leq 1.143 \times n_2 - 2.783$ and $k_2 \leq -0.194 \times n_2 + 0.839$ (Condition 3)

$k_2 \leq 1.070 \times n_2 - 2.520$ and $k_2 \leq -0.182 \times n_2 + 0.755$ (Condition 4)

$k_2 \leq 0.978 \times n_2 - 2.220$ and $k_2 \leq -0.154 \times n_2 + 0.640$ (Condition 5)

$k_2 \leq 0.899 \times n_2 - 1.964$ and $k_2 \leq -0.138 \times n_2 + 0.569$ (Condition 6)

$k_2 \leq 1.133 \times n_2 - 2.462$ and $k_2 \leq -0.186 \times n_2 + 0.657$ (Condition 7)

$k_2 \leq -0.201 \times n_2 + 0.665$ (Condition 8)

According to this disclosure, a mask blank for a phase shift mask can be provided, which has an etching stopper film having a high transmittance of 80% or more to an ArF exposure light of 193 nm wavelength and which can achieve a transmittance difference of 5% between a dug-down portion and a non-dug-down portion of a transparent portion.

BRIEF DESCRIPTION OF THE DRAWINGS

FIG. 1 is a cross-sectional view showing a configuration of the mask blank of the embodiment of this disclosure.

FIG. 2 is a cross-sectional view showing a configuration of the phase shift mask according to the embodiment of this disclosure.

FIG. 4 shows the relationship between a refractive index $n_2$ (refractive index $n_2$ ranging between 2.5 and 3.1) and an extinction coefficient $k_2$ (extinction coefficient $k_2$ ranging between 0.20 and 0.40), and a minimum film thickness d of an etching stopper film satisfying a transmittance difference of 5%, and the relationship between a refractive index $n_2$ and an extinction coefficient $k_2$, and a maximum film thickness d of an etching stopper film satisfying a transmittance of 80%, both relationships derived from the simulation result.

FIG. 5 shows the relationship between a refractive index $n_2$ (refractive index $n_2$ ranging between 2.3 and 3.1) and an extinction coefficient $k_2$ (extinction coefficient $k_2$ ranging between 0.05 and 0.40), and a minimum film thickness d of an etching stopper film satisfying a transmittance difference of 5%, and the relationship between a refractive index $n_2$ and an extinction coefficient $k_2$, and a maximum film thickness d of an etching stopper film satisfying a transmittance of 80%, both relationships derived from the simulation result.

FIG. 6 shows the relationship between a refractive index $n_2$ and an extinction coefficient $k_2$, and a maximum film thickness d of an etching stopper film satisfying a transmittance of 80% derived from the simulation result.

EMBODIMENT FOR CARRYING OUT THE INVENTION

Figure 3A:
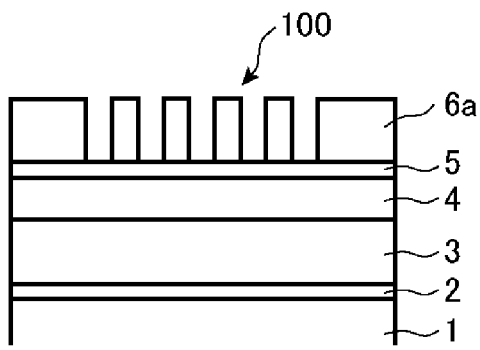
FIG. 3 is a schematic cross-sectional view showing a manufacturing process of the phase shift mask according to the embodiment of this disclosure.

First, the proceeding that has resulted in the completion of this disclosure is described. The inventors of this disclosure diligently studied to obtain a mask blank for a phase shift mask, in which an etching stopper film and a phase shift film of a mask blank for manufacturing a CPL mask have a high transmittance of 80% or more to an ArF exposure light, and which has an etching stopper film that can achieve a transmittance difference of 5% between a dug-down portion and a non-dug-down portion of a transparent portion.

In a mask blank having a structure in which a transparent substrate has stacked thereon an etching stopper film and a phase shift film in this order, the phase shift film is composed of a material containing silicon and oxygen, and its refractive index $n_2$ and an extinction coefficient $k_1$, and film thickness are restricted in terms of functions as a CPL mask. Therefore, it is necessary to control a refractive index $n_2$ and an extinction coefficient $k_2$ of the etching stopper film within a predetermined range.

The inventors focused herein on the relationship between a minimum film thickness of an etching stopper film and a refractive index $n_2$ and an extinction coefficient $k_2$ of an etching stopper film in order to satisfy the condition that a transmittance difference of a dug-down portion and a non-dug-down portion is 5% or more, and carried out an optical simulation on an etching stopper film and a phase shift film. The transmittance difference was calculated by obtaining a transmittance in the state where an etching stopper film alone is formed on a transparent substrate, and a transmittance in the state where a phase shift film is formed on an etching stopper film, and calculating the difference of each transmittance. In the optical simulation, a minimum film thickness d of an etching stopper film was calculated when a transmittance difference between a dug-down portion and a non-dug-down portion is 5% while the values of a refractive index $n_2$ and an extinction coefficient $k_2$ of the etching stopper film are changed respectively in the range between 2.5 and 3.1 for the refractive index $n_2$ and between 0.20 and 0.40 for the extinction coefficient $k_2$. The phase shift film herein had a film thickness of 177 (nm), a refractive index $n_1$ of 1.56, and an extinction coefficient $k_1$ of 0.00.

Thereafter, the relationship between a refractive index $n_2$ and an extinction coefficient $k_2$, and a minimum film thickness d of an etching stopper film achieving a transmittance difference of 5% or more between the dug-down portion and the non-dug-down portion was organized based on the simulation result. FIG. 4 shows approximation curves of an etching stopper film with 5% or more transmittance difference in the case of minimum film thicknesses d of 2.5 nm, 3.0 nm, 3.5 nm, 4.0 nm, 4.5 nm, and 5.0 nm by d=2.5 ($\Delta T$=5%), d=3.0 ($\Delta T$=5%), d=3.5 ($\Delta T$=5%), d=4.0 ($\Delta T$=5%), d=4.5 ($\Delta T$=5%) and d=5.0 ($\Delta T$=5%). Each approximation curve rises upward to the right. Thus, it was found that there is a positive correlation between a refractive index $n_2$ and an extinction coefficient $k_2$ in an etching stopper film with 5% or more transmittance difference. It was further found that in the graph of FIG. 4, the minimum film thickness of the etching stopper film increases moving from the lower right portion toward the upper left portion.

In addition, a surprising knowledge was obtained that when a transmittance in the state where an etching stopper film alone is formed on a transparent substrate and a transmittance in the state where a phase shift film is formed on an etching stopper film were calculated as mentioned above, the transmittance in the state where a phase shift film is formed on an etching stopper film (corresponding to transmittance of non-dug-down portion) is higher in value than the transmittance in the state where an etching stopper film alone is formed (corresponding to transmittance of dug-down portion) (generally, transmittance is considered as higher when a phase shift film is not formed on an etching stopper film). As will be mentioned below, increasing a transmittance difference and enhancing a transmittance are in a trade-off relationship. When a dug-down portion with a relatively low transmittance is used as a standard of a transmittance, it will be extremely difficult to prepare the aforementioned etching stopper film with 5% or more transmittance difference. Further, considering that a non-dug-down portion occupies a greater area than a dug-down portion in a transparent portion, a necessary phase shifting effect can be obtained with an etching stopper film satisfying 80% transmittance in a stacked structure with a phase shift film.

The inventors focused herein on the relationship between a maximum film thickness d of an etching stopper film and a refractive index $n_2$ and an extinction coefficient $k_2$ of an etching stopper film in order to satisfy the condition that a stacked structure of an etching stopper film and a phase shift film has a transmittance of 80% or more to a light of 193 nm wavelength, and carried out an optical simulation on an etching stopper film and a phase shift film. In the optical simulation, a maximum film thickness d of an etching stopper film when a transmittance is 80% was calculated while the values of a refractive index $n_2$ and an extinction coefficient $k_2$ of the etching stopper film are changed respectively in the range between 2.5 and 3.1 for the refractive index $n_2$ and between 0.20 and 0.40 for the extinction coefficient $k_2$. The ranges of a refractive index $n_2$ and an extinction coefficient $k_2$, a film thickness of the phase shift film, a refractive index $n_1$, and an extinction coefficient $k_1$ in the optical simulation are the same as those in the above-described simulation on the transmittance.

Thereafter, the inventors organized the relationship between a refractive index $n_2$ and an extinction coefficient $k_2$, and a maximum film thickness d of an etching stopper film satisfying 80% transmittance in a stacked structure with the phase shift film. FIG. 4 shows the relationship between a refractive index $n_2$ and an extinction coefficient $k_2$, and a maximum film thickness d of an etching stopper film satisfying a transmittance of 80% in a stacked structure with a phase shift film.

FIG. 4 shows approximation curves satisfying 80% transmittance when the maximum film thicknesses d of the etching stopper film are 2.5 nm, 3.0 nm, 3.5 nm, 4.0 nm, 4.5 nm, and 5.0 nm by d=2.5 (T=80%), d=3.0 (T=80%), d=3.5 (T=80%), d=4.0 (T=80%), d=4.5 (T=80%), and d=5.0 (T=80%). Each approximation curve falls downward to the right. Thus, it was found that there is a negative correlation between a refractive index $n_2$ and an extinction coefficient $k_2$ in an etching stopper film satisfying a transmittance of 80%. It was further found that in the graph of FIG. 4, a maximum film thickness of an etching stopper film increases moving from the upper right portion toward the lower left portion.

Then, the relationship between a refractive index $n_2$ and an extinction coefficient $k_2$, and a minimum film thickness d of an etching stopper film with 5% or more transmittance difference between a dug-down portion and a non-dug-down portion, and the relationship between a refractive index $n_2$ and an extinction coefficient $k_2$, and a maximum film thickness d of an etching stopper film satisfying a transmittance of 80% in a stacked structure with a phase shift film were organized, respectively, and a configuration in which the respective conditions are compatible was examined. In the graph of FIG. 4, an intersection of an approximation curve d=2.5 (T=80%) where a maximum film thickness d satisfying 80% transmittance is 2.5 nm and an approximation curve d=2.5 ($\Delta T$=5%) where a minimum film thickness d achieving 5% or more transmittance difference is 2.5 nm was calculated. Subsequently, an intersection of an approximation curve d=2.5 (T=80%) where a maximum film thickness d satisfying 80% transmittance is 2.5 nm and an approximation curve d=3.0 ($\Delta T$=5%) where a minimum film thickness d achieving 5% or more transmittance difference is 3.0 nm was calculated. Linear approximation was made through these two intersections, obtaining Equation (1-2). Other approximation curves d=3.0 (T=80%) . . . d=5.0 (T=80%) satisfying 80% transmittance were calculated respectively to obtain an intersection with approximation curves d=3.0 (ΔT=5%) . . . d=5.0 (ΔT=5%) achieving 5% or more transmittance difference, linear approximation was similarly performed, and Equations (2-2) . . . (5-2) were obtained. Similarly, each of the approximation curves d=3.0 (ΔT=5%) . . . d=5.0 (ΔT=5%) satisfying 5% or more transmittance difference was calculated to obtain an intersection with respective approximation curves d=2.5 (T=80%), d=3.0 (T=80%), . . . d=5.0 (T=80%) satisfying 80% transmittance, linear approximation was similarly performed, and Equations (1-1) . . . (5-1) were obtained.

As a result, it was found that the condition of 80% or more transmittance and the condition of 5% or more transmittance difference can be made compatible with the values $n_2$ and $k_2$ in the graph of FIG. 4 in a region below the Equations (1-2), (2-2), (3-2), (4-2), and (5-2) satisfying 80% transmittance in each maximum film thickness and in a region at the right side of the Equations (1-1), (2-1), (3-1), (4-1), and (5-1) with 5% or more transmittance difference in each minimum film thickness (values $n_2$ and $k_2$ in FIG. 4 in a region excluding region B).

Namely, it was found that the condition of 80% or more transmittance and the condition of 5% or more transmittance difference can be made compatible when an etching stopper film has a refractive index $n_2$ of 2.5 or more and 3.1 or less to a light of 193 nm wavelength and an extinction coefficient $k_2$ of 0.4 or less to a light of 193 nm wavelength, and when the refractive index $n_2$ and the extinction coefficient $k_2$ of the etching stopper film satisfy at least one of the five conditions:

$k_2 \leq 1.333 \times n_2 - 3.564$ and $k_2 \leq -0.200 \times n_2 + 0.998$ (Condition 1)

$k_2 \leq 1.212 \times n_2 - 3.073$ and $k_2 \leq -0.174 \times n_2 + 0.841$ (Condition 2)

$k_2 \leq 1.143 \times n_2 - 2.783$ and $k_2 \leq -0.194 \times n_2 + 0.839$ (Condition 3)

$k_2 \leq 1.070 \times n_2 - 2.520$ and $k_2 \leq -0.182 \times n_2 + 0.755$ (Condition 4)

$k_2 \leq 0.978 \times n_2 - 2.220$ and $k_2 \leq -0.154 \times n_2 + 0.640$ (Condition 5)

The equalities of the first equations in (Condition 1) to (Condition 5) correspond to Equations (1-1), (2-1), (3-1), (4-1), and (5-1), and the equalities of the second equations in (Condition 1) to (Condition 5) correspond to (1-2), (2-2), (3-2), (4-2), and (5-2).

On the other hand, the aforementioned two optical simulations (the optical simulation to calculate a minimum film thickness of an etching stopper film with 5% transmittance difference between a dug-down portion and a non-dug-down portion; and an optical simulation to calculate a maximum film thickness d of an etching stopper film with 80% or more transmittance to a light of 193 nm wavelength with a stacked structure of an etching stopper film and a phase shift film) were performed, each extending the range of values of a refractive index $n_2$ and an extinction coefficient $k_2$ of the etching stopper film. Concretely, the refractive index $n_2$ was set within a range between 2.3 and 3.1, and the extinction coefficient $k_2$ was set within a range between 0.05 and 0.40 to perform these optical simulations.

Thereafter, based on the result of these optical simulations, the relationship between a refractive index $n_2$ and an extinction coefficient $k_2$, and a minimum film thickness d of an etching stopper film with 5% or more transmittance difference between a dug-down portion and a non-dug-down portion, and the relationship between a refractive index $n_2$ and an extinction coefficient $k_2$, and a maximum film thickness d of an etching stopper film satisfying a transmittance of 80% in a stacked structure with a phase shift film were organized, respectively, in the same procedure as above.

FIG. 5 shows approximation curves of an etching stopper film with 5% or more transmittance difference in the case of minimum film thicknesses d=2.5 nm, 3.0 nm, 3.5 nm, 4.0 nm, 4.5 nm, 5.0 nm, 5.5 nm, 6.0 nm, 6.5 nm, 7.0 nm, 7.5 nm, and 8.0 nm by d=2.5 (ΔT=5%), d=3.0 (ΔT=5%), d=3.5 (ΔT=5%), d=4.0 (ΔT=5%), d=4.5 (ΔT=5%), d=5.0 (ΔT=5%), d=5.5 (ΔT=5%), d=6.0 (ΔT=5%), d=6.5 (ΔT=5%), d=7.0 (ΔT=5%), d=7.5 (ΔT=5%), and d=8.0 (ΔT=5%).

Further, FIG. 5 shows approximation curves of an etching stopper film satisfying 80% transmittance in the case of maximum film thicknesses d=2.5 nm, 3.0 nm, 3.5 nm, 4.0 nm, 4.5 nm, 5.0 nm, 5.5 nm, 6.0 nm, 6.5 nm, 7.0 nm, 7.5 nm, 8.0 nm, 8.5 nm, 9.0 nm, and 9.5 nm by d=2.5 (T=80%), d=3.0 (1=80%), d=3.5 (T=80%), d=4.0 (1=80%), d=4.5 (1=80%), d=5.0 (T=80%), d=5.5 (T=80%), d=6.0 (T=80%), d=6.5 (T=80%), d=7.0 (1=80%), d=7.5 (T=80%), d=8.0 (1=80%), d=8.5 (1=80%), d=9.0 (T=80%), and d=9.5 (T=80%).

In FIG. 5, the region where a refractive index $n_2$ ranges between 2.5 and 3.1 and an extinction coefficient $k_2$ ranges between 0.20 and 0.40 is the same result as FIG. 4. Therefore, the conclusion is that in the case of FIG. 5 as well, each of the refractive index $n_2$ and the extinction coefficient $k_2$ simultaneously satisfying the condition of 80% or more transmittance and 5% or more transmittance difference only needs to satisfy any one of the five conditions (Condition 1), (Condition 2), (Condition 3), (Condition 4), and (Condition 5) derived from the result of FIG. 4, in a transmittance ranging between 2.5 to 3.1 and an extinction coefficient $k_2$ ranging between 0.20 and 0.40.

In the region in FIG. 5 where a refractive index $n_2$ ranges between 2.5 and 3.1 and an extinction coefficient $k_2$ ranges between 0.05 and 0.20, a maximum film thickness of an etching stopper film of 80% or more transmittance always exceeds a minimum film thickness of an etching stopper film satisfying the condition of 5% or more transmittance difference in any combination of a refractive index $n_2$ and an extinction coefficient $k_2$. Therefore, it can be considered as possible to design an etching stopper film that simultaneously satisfies the condition of 80% or more transmittance and the condition of 5% or more transmittance difference in the region where a refractive index $n_2$ ranges between 2.5 and 3.1 and an extinction coefficient $k_2$ ranges between 0.05 and 0.20.

The region in FIG. 5 where a refractive index $n_2$ ranges between 2.3 and 2.5 and an extinction coefficient $k_2$ ranges between 0.05 and 0.40 includes a region where an etching stopper film that simultaneously satisfies the condition of 80% or more transmittance and the condition of 5% or more transmittance difference cannot be designed. The region where an etching stopper film cannot be designed was derived by the same procedure as the case of FIG. 4. Concretely, in the graph of FIG. 5, an intersection of an approximation curve d=5.0 (T=80%) where a maximum film thickness d satisfying 80% transmittance is 5.0 nm and an approximation curve d=5.0 (ΔT=5%) where a minimum film thickness d achieving 5% or more transmittance difference is 5.0 nm was calculated. Subsequently, an intersection of an approximation curve d=5.0 (T=80%) where a maximum film thickness d satisfying 80% transmittance is 5.0 nm and an approximation curve d=5.5 (ΔT=5%) where a minimum film thickness d achieving 5% or more transmittance difference is 5.5 nm was calculated. Linear approximation was made through these two intersections, obtaining Equation (6-2).

An intersection of an approximation curve d=5.5 (T=80%) where a maximum film thickness d satisfying 80% transmittance is 5.5 nm and an approximation curve d=5.5 (ΔT=5%) where a minimum film thickness d achieving 5% or more transmittance difference is 5.5 nm was calculated. Linear approximation was made through the intersection and the intersection of an approximation curve d=5.0 (T=80%) where a maximum film thickness d satisfying 80% transmittance is 5.0 nm and an approximation curve d=5.5 (ΔT=5%) where a minimum film thickness d achieving 5% or more transmittance difference is 5.5 nm that has already been calculated, obtaining Equation (6-1).

Next, an intersection of an approximation curve d=5.5 (T=80%) where a maximum film thickness d satisfying 80% transmittance is 5.5 nm and an approximation curve d=6.0 (ΔT=5%) where a minimum film thickness d achieving 5% or more transmittance difference is 6.0 nm was calculated. Linear approximation was made through the intersection and the intersection of an approximation curve d=5.5 (T=80%) where a maximum film thickness d satisfying 80% transmittance is 5.5 nm and an approximation curve d=5.5 (ΔT=5%) where a minimum film thickness d achieving 5% or more transmittance difference is 5.5 nm that has already been calculated, obtaining Equation (7-2).

Next, an intersection of an approximation curve d=6.0 (T=80%) where a maximum film thickness d satisfying 80% transmittance is 6.0 nm and an approximation curve d=6.0 (ΔT=5%) where a minimum film thickness d achieving 5% or more transmittance difference is 6.0 nm was calculated. Linear approximation was made through the intersection and the intersection of an approximation curve d=5.5 (T=80%) where a maximum film thickness d satisfying 80% transmittance is 5.5 nm and an approximation curve d=6.0 (ΔT=5%) where a minimum film thickness d achieving 5% or more transmittance difference is 6.0 nm that has already been calculated, obtaining Equation (7-1).

Next, an intersection of an approximation curve d=6.0 (T=80%) where a maximum film thickness d satisfying 80% transmittance is 6.0 nm and an approximation curve d=6.5 (ΔT=5%) where a minimum film thickness d achieving 5% or more transmittance difference is 6.5 nm was calculated. Linear approximation was made through the intersection and the intersection of an approximation curve d=6.0 (T=80%) where a maximum film thickness d satisfying 80% transmittance is 6.0 nm and an approximation curve d=6.0 (ΔT=5%) where a minimum film thickness d achieving 5% or more transmittance difference is 6.0 nm that has already been calculated, obtaining Equation (8). It was also found from FIG. 5 that a minimum film thickness d with 5% or more transmittance difference does not exceed a maximum film thickness d that satisfies 80% transmittance in the range where a maximum film thickness d satisfying 80% transmittance exceeds 6.0 nm.

It was found from these results that the condition of 80% or more transmittance and the condition of 5% or more transmittance difference can be made compatible with the values $n_2$ and $k_2$ in the graph of FIG. 5 in a region below the Equations (1-2), (2-2), (3-2), (4-2), (5-2), (6-2), (7-2), and (8) satisfying 80% transmittance in each maximum film thickness and in a region at the right side of the Equations (1-1), (2-1), (3-1), (4-1), (5-1), (6-1), and (7-1) with 5% or more transmittance difference in each minimum film thickness (values $n_2$ and $k_2$ in FIG. 5 excluding region B).

Namely, it was found that the condition of 80% or more transmittance and the condition of 5% or more transmittance difference can be made compatible when the etching stopper film has a refractive index $n_2$ of 2.3 or more and 3.1 or less to a light of 193 nm wavelength and an extinction coefficient $k_1$ of 0.4 or less to a light of 193 nm wavelength, and when the refractive index $n_2$ and the extinction coefficient $k_2$ of the etching stopper film satisfy at least one of the eight conditions:

$k_2 \leq 1.333 \times n_2 - 3.564$ and $k_2 \leq -0.200 \times n_2 + 0.998$ (Condition 1)

$k_2 \leq 1.212 \times n_2 - 3.073$ and $k_2 \leq -0.174 \times n_2 + 0.841$ (Condition 2)

$k_2 \leq 1.143 \times n_2 - 2.783$ and $k_2 \leq -0.194 \times n_2 + 0.839$ (Condition 3)

$k_2 \leq 1.070 \times n_2 - 2.520$ and $k_2 \leq -0.182 \times n_2 + 0.755$ (Condition 4)

$k_2 \leq 0.978 \times n_2 - 2.220$ and $k_2 \leq -0.154 \times n_2 + 0.640$ (Condition 5)

$k_2 \leq 0.899 \times n_2 - 1.964$ and $k_2 \leq -0.138 \times n_2 + 0.569$ (Condition 6)

$k_2 \leq 1.133 \times n_2 - 2.462$ and $k_2 \leq -0.186 \times n_2 + 0.657$ (Condition 7)

$k_2 \leq -0.201 \times n_2 + 0.665$ (Condition 8)

The equalities of the first equations in (Condition 1) to (Condition 7) correspond to Equations (1-1), (2-1), (3-1), (4-1), (5-1), (6-1), and (7-1). Further, the equalities of the second equations in (Condition 1) to (Condition 7) correspond to Equations (1-2), (2-2), (3-2), (4-2), (5-2), (6-2), and (7-2). Moreover, the equality of the equation in (Condition 8) corresponds to Equation (8).

This disclosure has been made as a result of the diligent studies described above. The approximate curves shown in FIGS. 4 and 5 vary slightly depending on calculation methods. However, the variation in the ranges of a refractive index $n_2$ and an extinction coefficient $k_2$ caused by the above variation only slightly affects a transmittance difference, a film thickness, and a transmittance of an etching stopper film, and is within an allowable range.

First Embodiment

[Mask Blank and its Manufacture]

The embodiment is explained below with reference to the drawings.

A mask blank according to the first embodiment of this disclosure is a mask blank used for manufacturing a CPL (Chromeless Phase Lithography) mask, namely, a chromeless phase shift mask. A CPL mask is a phase shift mask of a type in which basically no light shielding film is provided in a transfer pattern forming region excluding a region of a large pattern, and a transfer pattern is formed by a dug-down portion and a non-dug-down portion of a transparent substrate.

FIG. 1 shows a configuration of a mask blank of the first embodiment. A mask blank 100 according to the first embodiment has an etching stopper film 2, a phase shift film 3, a light shielding film 4, and a hard mask film 5 on a main surface of a transparent substrate 1.

There is no particular limitation for the transparent substrate 1, as long as the transparent substrate 1 has a high transmittance to an exposure light and sufficient rigidity. In this disclosure, a synthetic quartz glass substrate and other types of glass substrates (e.g., soda-lime glass, aluminosilicate glass, etc.) can be used. Among these substrates, a synthetic quartz glass substrate is particularly preferable for the mask blank substrate of this disclosure used in forming a high-fineness transfer pattern for having a high transmittance to an ArF excimer laser light (193 nm wavelength) or at a region with shorter wavelength. The transparent substrate 1 preferably has a refractive index $n_3$ of 1.5 or more and 1.6 or less to a light of 193 nm wavelength, and an extinction coefficient $k_3$ of 0.1 or less to a light of 193 nm wavelength. Incidentally, the lower limit of an extinction coefficient $k_3$ of the transparent substrate 1 is 0.0.

The etching stopper film 2 is made of a material that satisfies any of the aforementioned (Condition 1) to (Condition 8). The etching stopper film 2 is made of a material capable of obtaining an etching selectivity between the phase shift film 3 to dry etching using fluorine-based gas when patterning the phase shift film 3. The etching stopper film 2 is left without being removed on the entire surface of a transfer pattern forming region 101 when a phase shift mask 200 is completed (see FIG. 2). Namely, the etching stopper film 2 remains even in a dug-down portion which is a region in the transparent portion without a phase shift pattern 3b. Therefore, the etching stopper film 2 is preferably formed in contact with a main surface of the transparent substrate 1 without any intervening film between the transparent substrate 1.

A transmittance of the etching stopper film 2 in a stacked structure when a transmittance of the transparent substrate 1 to an exposure light is 100% is preferably 80% or more, and more preferably 85% or more. A difference between a transmittance of a stacked structure of the etching stopper film 2 and the phase shift film 3 to a light of 193 nm wavelength and a transmittance of the etching stopper film 2 alone to a light of 193 nm wavelength is preferably 5% or more, and more preferably 6% or more.

The etching stopper film 2 preferably has an oxygen content of 50 atom % or more. This is because the etching stopper film 2 is required to contain a large amount of oxygen in order to make a transmittance to an exposure light equal to or greater than the aforementioned value. On the other hand, the oxygen content of the etching stopper film 2 is preferably 67 atom % or less.

The etching stopper film 2 is preferably composed of a material containing hafnium and oxygen, in view of chemical durability and cleaning durability. It is preferable that the etching stopper film 2 does not contain an element which reduces an etching selectivity between the phase shift film 3 to dry etching using fluorine-based gas (e.g., silicon). Further, the etching stopper film 2 is more preferably made of a material being composed of hafnium and oxygen. The material being composed of hafnium and oxygen herein indicates a material containing, in addition to these constituent elements, only the elements inevitably contained in the etching stopper film 2 when the film is made by a sputtering method (noble gas such as helium (He), neon (Ne), argon (Ar), krypton (Kr), and xenon (Xe), hydrogen (H), carbon (C), etc.). By minimizing the presence of other elements to be bonded to hafnium in the etching stopper film 2, the ratio of bonding of hafnium and oxygen in the etching stopper film 2 can be significantly increased. Therefore, it is preferable that the total content of the above-mentioned elements (noble gas, hydrogen, carbon, etc.) which are inevitably contained in the etching stopper film 2 is 3 atom % or less. The etching stopper film 2 preferably has an amorphous structure. Thus, a surface roughness of the etching stopper film 2 can be improved, and a transmittance to an exposure light can also be enhanced.

On the other hand, the etching stopper film 2 preferably contains not only hafnium but also a metal element having an action to reduce an extinction coefficient $k_2$ of the etching stopper film 2 from the viewpoint of increasing a transmittance of the etching stopper film 2 to an ArF exposure light. From this point of view, aluminum, zirconium, indium, tin, etc. can be given as the metal elements to be contained in the etching stopper film 2. For example, in forming the etching stopper film 2 from a material containing hafnium, aluminum, and oxygen, the ratio of the content [atom %] of hafnium (Hf) to the total content [atom %] of hafnium (Hf) and aluminum (Al) (Hf/[Hf+Al] ratio) of the etching stopper film 2 is preferably 0.86 or less. Hf/[Hf+Al] ratio of the etching stopper film 2 in such a case is preferably 0.60 or more.

The etching stopper film 2 preferably has a thickness of 1 nm or more based on the premise of satisfying any of the aforementioned (Condition 1) to (Condition 8). Considering the influence of dry etching by fluorine-based gas and the influence of chemical cleaning performed during manufacture of the phase shift mask 200 from the mask blank 100, the thickness of the etching stopper film 2 is preferably 1 nm or more. The thickness of the etching stopper film 2 is more preferably 2 nm or more.

Although the etching stopper film 2 is made of a material having a high transmittance to an exposure light, the transmittance decreases as the thickness increases. Further, the etching stopper film 2 has a higher refractive index than the material forming the transparent substrate 1, and as the thickness of the etching stopper film 2 increases, the influence on designing a mask pattern to be actually formed in the phase shift film 3 increases. Considering these points, the etching stopper film 2 is preferably 10 nm or less, more preferably 5 nm or less, and even more preferably 4 nm or less.

A refractive index $n_2$ to a light of 193 nm wavelength of the etching stopper film 2 is preferably 3.1 or less, and more preferably 3.0 or less. This is to reduce the influence on designing a mask pattern to be actually formed in the phase shift film 3. The etching stopper film 2 is made at a refractive index $n_2$ of 2.5 or more. On the other hand, an extinction coefficient $k_2$ to a light of 193 nm wavelength (hereafter simply referred to as extinction coefficient $k_2$) of the etching stopper film is preferably 0.4 or less. This is for enhancing a transmittance of the etching stopper film 2 to an exposure light. An extinction coefficient $k_2$ of the etching stopper film 2 is preferably 0.05 or more, more preferably 0.1 or more, and even more preferably 0.2 or more.

The etching stopper film 2 preferably has a high uniformity of composition in the thickness direction (i.e., difference in content amount of each constituent element in the thickness direction is within a variation width of 5 atom %). On the other hand, the etching stopper film 2 can be formed as a film structure with a composition gradient in the thickness direction.

The phase shift film 3 is composed of a material containing silicon and oxygen that is transparent to an exposure light, and has a predetermined phase difference. Concretely, the phase shift film 3 of the transparent portion is patterned to form a non-dug-down portion where the phase shift film 3 exists and a dug-down portion where the phase shift film 3 does not exist, so as to achieve a relationship (predetermined phase difference) in which the phase of an exposure light transmitted through the non-dug-down portion where the phase shift film 3 exists is substantially inverted with respect to the exposure light (ArF excimer laser exposure light) transmitted through the dug-down portion where the phase shift film 3 does not exist. In this way, the light beams which have come around each other's regions by a diffraction phenomenon cancel each other, so that the light intensity at the boundary is substantially zero and the resolution is improved.

The phase shift film 3 preferably has a function (transmittance) to transmit a light of 193 nm wavelength with a transmittance of 95% or more and a function to generate a phase difference of 150 degrees or more and 210 degrees or less between an exposure light transmitted through the phase shift film 3 and the light transmitted through the air by the same distance as the thickness of the phase shift film 3. Further, the phase difference in the phase shift film 3 is preferably 150 degrees or more and 200 degrees or less, and more preferably 150 degrees or more and 190 degrees or less. A transmittance of the phase shift film 3 to an exposure light is preferably 96% or more, and more preferably 97% or more, in view of enhancing exposure efficiency.

The thickness of the phase shift film 3 is preferably 200 nm or less, and more preferably 190 nm or less. On the other hand, the thickness of the phase shift film 3 is preferably 143 nm or more, and more preferably 153 nm or more.

For the phase shift film 3 to satisfy the conditions regarding the optical characteristics and the film thickness mentioned above, a refractive index $n_1$ to a light of 193 nm wavelength is required to be 1.5 or more, more preferably 1.52 or more, and even more preferably 1.54 or more. Further, a refractive index $n_1$ of the phase shift film 3 is preferably 1.68 or less, more preferably 1.63 or less, and even more preferably 1.60 or less. An extinction coefficient $k_1$ to a light of 193 nm wavelength of the phase shift film 3 is desired to be 0.1 or less, more preferably 0.02 or less, and even more preferably close to 0.

Incidentally, a refractive index n and an extinction coefficient k of a thin film including the phase shift film 3 are not determined only by the composition of the thin film. Film density and crystal condition of the thin film are also the factors that affect a refractive index n and an extinction coefficient k. Therefore, the conditions in forming a thin film by reactive sputtering are adjusted so that the thin film reaches predetermined refractive index n and extinction coefficient k. In forming the phase shift film 3 by reactive sputtering, for allowing a refractive index $n_1$ and an extinction coefficient $k_1$ to be within the above range, it is effective to adjust the ratio of mixed gas of noble gas and reactive gas (oxygen gas). However, various other adjustments are made, such as pressure in a film forming chamber upon forming a film by reactive sputtering, power applied to a sputtering target, and positional relationship such as distance between a target and the transparent substrate 1. Further, these film forming conditions are unique to film forming apparatuses which are adjusted arbitrarily so that the phase shift film 3 to be formed reaches predetermined refractive index $n_1$ and extinction coefficient $k_1$.

While the phase shift film 3 can be configured from a single layer or a stack of multiple layers, the phase shift film 3 is composed of a material containing silicon and oxygen. By adding oxygen to silicon, high transparency to an exposure light can be ensured, and preferable optical characteristics as the phase shift film 3 can be obtained.

As mentioned above, the phase shift film 3 is composed of a material containing silicon and oxygen. In order to improve a transmittance and light fastness to an exposure light, and to enhance workability by dry etching, the phase shift film 3 preferably contains elements other than silicon and oxygen at an amount of preferably 5 atom % or less, and more preferably 3 atom % or less. More preferably, the phase shift film 3 is made of a material being composed of silicon and oxygen, such as $SiO_2$. In forming the phase shift film 3 by sputtering, noble gas such as helium (He), neon (Ne), argon (Ar), krypton (Kr), and xenon (Xe) used as buffer gas of the film, and hydrogen (H), carbon (C), etc. existing in a vacuum are inevitably contained. Even in this case, the total content of these elements other than silicon and oxygen contained in the phase shift film 3 is preferably 5 atom % or less, and more preferably 3 atom % or less by optimizing the film forming conditions or performing annealing after the film formation.

While the phase shift film 3 of a silicon oxide-based material is formed by sputtering, any sputtering method is applicable such as DC sputtering, RF sputtering, and ion beam sputtering. In the case where a target has a low conductivity (silicon target, $SiO_2$ target, etc.), it is preferable to apply RF sputtering and ion beam sputtering. Application of RF sputtering is preferable, considering the film forming rate.

A single layer structure and a stacked structure of two or more layers are applicable to the light shielding film 4. Further, each layer of the light shielding film of a single layer structure and the light shielding film with a stacked structure of two or more layers can be configured by approximately the same composition in the thickness direction of the layer or the film, or with a composition gradient in the thickness direction of the layer.

The light shielding film 4 is required to have a function of shielding an exposure light with a high light shielding rate. The light shielding film 4 is desired to ensure an optical density (OD) greater than 2.0, preferably 2.8 or more OD, and further preferably 3.0 or more OD. As shown in FIG. 2, a light shielding band forming region 102 herein is a light shielding region formed outside the transfer pattern forming region 101 where a pattern (circuit pattern) to be subjected to exposure transfer is formed. The light shielding band forming region 102 is made for the purpose of preventing adverse effects (overlapping of exposure light) due to adjacent exposure upon exposure transfer to the wafer.

The mask blank 100 of the embodiment shown in FIG. 1 is configured by stacking the light shielding film 4 on the phase shift film 3 without an intervening film. For the light shielding film 4 of this configuration, it is necessary to apply a material having a sufficient etching selectivity to etching gas used in forming a pattern in the phase shift film 3. The light shielding film 4 in this case is preferably made of a material containing chromium. Materials containing chromium for forming the light shielding film 4 can include, in addition to chromium metal, a material containing chromium and one or more elements selected from oxygen, nitrogen, carbon, boron, and fluorine.

While a chromium-based material is generally etched by mixed gas of chlorine-based gas and oxygen gas, an etching rate of the chromium metal to the etching gas is not as high. Considering enhancing an etching rate of mixed gas of chlorine-based gas and oxygen gas to etching gas, the material forming the light shielding film 4 preferably contains chromium and one or more elements selected from oxygen, nitrogen, carbon, boron, and fluorine. Further, one or more elements among molybdenum, indium, and tin can be included in the material containing chromium for forming the light shielding film 4. Including one or more elements among molybdenum, indium, and tin can increase an etching rate to mixed gas of chlorine-based gas and oxygen gas.

In the mask blank 100, a preferable configuration is that the light shielding film 4 has further stacked thereon a hard mask film 5 made of a material having an etching selectivity to etching gas used in etching the light shielding film 4. Since the hard mask film 5 is basically not restricted by an optical density, the thickness of the hard mask film 5 can be reduced significantly compared to the thickness of the light shielding film 4. A resist film of an organic material only requires a film thickness to function as an etching mask until dry etching for forming a pattern in the hard mask film 5 is completed. Therefore, the thickness of the resist film can be reduced significantly compared to conventional cases. Reduction of the film thickness of a resist film is effective for enhancing resist resolution and preventing collapse of pattern, which is extremely important in facing the requirements for miniaturization.

In the case where the light shielding film 4 is made of a material containing chromium, the hard mask film 5 is preferably made of a material containing silicon. The hard mask film 5 in this case tends to have low adhesiveness with a resist film of an organic material. Therefore, it is preferable to treat the surface of the hard mask film 5 with HMDS (Hexamethyldisilazane) to enhance surface adhesiveness. The hard mask film 5 in this case is more preferably made of $SiO_2$, SiN, SiON, etc.

Further, in the case where the light shielding film is made of a material containing chromium, the materials containing tantalum are also applicable as the materials of the hard mask film 5, in addition to the material containing silicon given above. The material containing tantalum in this case includes, in addition to tantalum metal, a material containing tantalum and one or more elements selected from nitrogen, oxygen, boron, and carbon.

On the other hand, the light shielding film 4 can have a structure where a layer being composed of a material containing chromium and a layer being composed of a material containing a transition metal and silicon are stacked, in this order, from the phase shift film 3 side. Concrete matters on the material containing chromium in this case are similar to the case of the light shielding film 4 described above. The transition metal to be included in the layer being composed of a material containing a transition metal and silicon includes one metal among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), palladium (Pd), etc., or an alloy of these metals. Metal elements other than the transition metal elements to be included in the layer include aluminum (Al), indium (In), tin (Sn), gallium (Ga), etc.

In the case where the light shielding film 4 has a structure where a layer being composed of a material containing chromium and a layer being composed of a material containing a transition metal and silicon are stacked as mentioned above, the hard mask film 5 is preferably made of a material containing chromium.

In the mask blank 100, a resist film of an organic material is preferably formed in contact with a surface of the hard mask film 5 at the film thickness of 100 nm or less. In the case of a fine pattern to meet DRAM hp32 nm generation, a SRAF (Sub-Resolution Assist Feature) with 40 nm line width may be provided on a transfer pattern (phase shift pattern) to be formed in the hard mask film 5. Even in this case, cross-sectional aspect ratio of the resist pattern can be reduced down to 1:2.5 so that collapse and peeling off of the resist pattern can be prevented in rinsing, developing of the resist film, etc. Incidentally, the resist film preferably has a film thickness of 80 nm or less, since collapse and peeling off of the resist pattern can further be prevented.

While the etching stopper film 2, the phase shift film 3, the light shielding film 4, and the hard mask film 5 are formed by sputtering, any sputtering method is applicable such as DC sputtering, RF sputtering, and ion beam sputtering. In the case where a target has a low conductivity, application of RF sputtering and ion beam sputtering is preferable. Application of RF sputtering is more preferable, considering the film forming rate.

In the method of forming the etching stopper film 2, it is preferable to arrange a target containing hafnium (hafnium target substantially free of oxygen excluding surface layer or target containing hafnium and oxygen) in a film forming chamber to form the etching stopper film 2 on the transparent substrate 1. Concretely, the transparent substrate 1 is placed on a substrate stage in a film forming chamber, and a predetermined voltage is applied (preferably RF power source in this case) to the target under a noble gas atmosphere such as argon gas (or mixed gas atmosphere of oxygen gas or oxygen-containing gas). As a result, a sputtering phenomenon occurs due to collision of plasmarized noble gas particles with the target, and the etching stopper film 2 containing hafnium and oxygen is formed on the surface of the transparent substrate 1. In this circumstance, the film forming condition is set so that a film thickness, a refractive index $n_2$, and an extinction coefficient $k_2$ of the etching stopper film 2 satisfy any of the aforementioned (Condition 1) to (Condition 5).

As described above, in the mask blank 100 of the first embodiment, the mask blank 100 for a phase shift mask can be provided, which includes the etching stopper film 2 with a high transmittance of 80% or more to an ArF exposure light and which can obtain a transmittance difference of 5% or more at a transparent portion.

[Phase Shift Mask and its Manufacture]

A phase shift mask 200 (see FIG. 2) of the first embodiment is featured in that the etching stopper film 2 of the mask blank 100 is left on the entire main surface of the transparent substrate 1, a phase shift pattern 3a is formed in the phase shift film 3, and a light shielding pattern 4b is formed in the light shielding film 4. Incidentally, the hard mask film 5 is removed during manufacture of the phase shift mask 200 (see FIG. 3).

Namely, the phase shift mask 200 according to the first embodiment has a structure where the transparent substrate 1 has stacked thereon the etching stopper film 2, the phase shift pattern 3a, and the light shielding pattern 4b in this order. The phase shift pattern 3a is composed of a material containing silicon and oxygen. The etching stopper film 2 is featured in being made of a material that satisfies any of the aforementioned (Condition 1) to (Condition 5). The etching stopper film 2 is made of a material capable of obtaining an etching selectivity between the phase shift film 3 to dry etching using fluorine-based gas when patterning the phase shift film 3. Concrete configurations of the transparent substrate 1, the etching stopper film 2, the phase shift pattern 3a, and the light shielding pattern 4b of the phase shift mask 200 are similar to the mask blank 100.

The method of manufacturing the phase shift mask 200 of the first embodiment is explained below according to the manufacturing steps shown in FIG. 3 showing a cross-sectional structure of a major portion. Described herein is the case where a material containing chromium is applied to the light shielding film 4, and a material containing silicon is applied to the hard mask film 5.

First, a resist film is formed in contact with the hard mask film 5 of the mask blank 100 by spin coating. Next, a pattern to be formed in the phase shift film 3 is written on the resist film with an electron beam, and predetermined treatments such as developing are further conducted to thereby form a first resist pattern 6a (see FIG. 3(a)). Subsequently, dry etching is conducted using fluorine-based gas with the first resist pattern 6a as a mask, and a hard mask pattern 5a is formed in the hard mask film 5 (see FIG. 3(b)).

Next, the first resist pattern 6a is removed. Next, dry etching is carried out using mixed gas of chlorine-based gas and oxygen-based gas with the hard mask pattern 5a as a mask, and a light shielding pattern 4a is formed in the light shielding film 4 (see FIG. 3(c)). Subsequently, dry etching is carried out using fluorine-based gas with the light shielding pattern 4a as a mask, and a phase shift pattern 3a is formed in the phase shift film 3 (see FIG. 3(d)). The hard mask pattern 5a is removed by this dry etching.

Figure 3E:
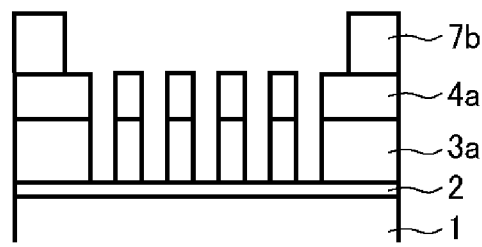

Subsequently, a resist film is formed by spin coating, and thereafter, a pattern which should be formed in the light shielding film 4 (pattern including light shielding band) is written with an electron beam on the resist film, and predetermined treatments such as developing are further conducted, to thereby form a second resist pattern 7b (see FIG. 3(e)).

Figure 3B:
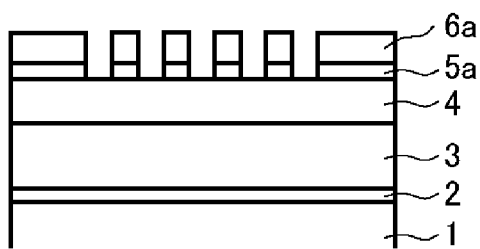
Figure 3F:
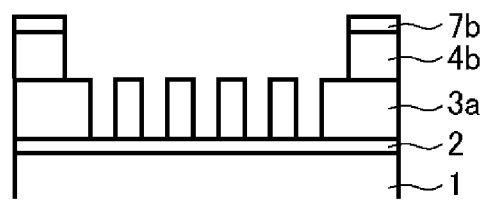
Figure 3C:
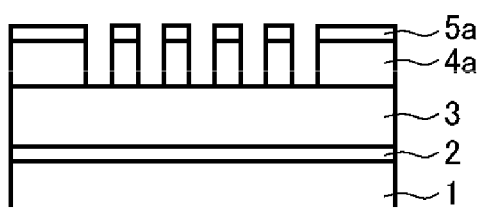
Figure 3G:
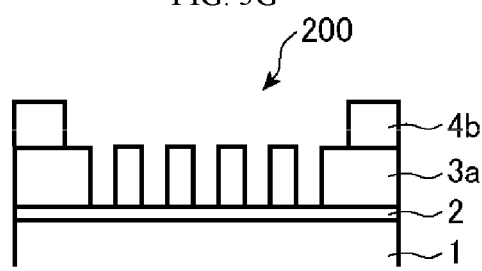

Next, dry etching is carried out using mixed gas of chlorine-based gas and oxygen gas with the second resist pattern 7b as a mask, and a light shielding pattern 4b is formed in the light shielding film 4 (see FIG. 3(f)).

Thereafter, the second resist pattern 7b is removed and moves on to a cleaning step. After the cleaning step, a mask defect inspection is performed as necessary using a light of 193 nm wavelength. Further, depending on the result of the defect inspection, a defect repair is carried out as necessary and the phase shift mask 200 is manufactured (see FIG. 3(g)). The etching stopper film has a high transmittance of 80% or more to an ArF exposure light of 193 nm wavelength and can obtain a transmittance difference of 5% or more at a transparent portion. Therefore, it is possible to form a pattern at a high precision.

[Manufacture of Semiconductor Device]

The method of manufacturing a semiconductor device according to the first embodiment is featured in that a transfer pattern is expose-transferred to a resist film on a semiconductor substrate using the phase shift mask 200 of the first embodiment or the phase shift mask 200 manufactured by using the mask blank 100 of the first embodiment. Therefore, when an exposure transfer is made on a resist film on a semiconductor device using the phase shift mask 200 of the first embodiment, a pattern can be formed in the resist film on the semiconductor device at a precision sufficiently satisfying the design specification.

A description has been given in the foregoing on an embodiment in which the mask blank 100 of the first embodiment is applied to manufacture a CPL mask. However, the mask blank of this disclosure is not particularly limited to the CPL mask, and can similarly be applied for manufacturing a Levenson type phase shift mask, for example.

ALTERNATIVE EMBODIMENT

An alternative embodiment is explained below by FIG. 6. FIG. 6 shows the relationship between a refractive index $n_2$ and an extinction coefficient $k_2$, and a maximum film thickness d of an etching stopper film satisfying the transmittance of 80% derived from the simulation result. Depending on the line width, etc. of a desired pattern, there may be cases where the condition of transmittance difference needs not be satisfied, if a transmittance is 80% or more. There may be cases that need to ensure 3 nm or more minimum film thickness d of an etching stopper film on the viewpoint of uniformity in in-plane film thickness distribution, etc.

Considering such circumstances, the relationship between a refractive index $n_2$ and an extinction coefficient $k_2$, and a maximum film thickness d of an etching stopper film satisfying a transmittance of 80% in a stacked structure with a phase shift film was organized, as mentioned above on FIG. 4. Equation (A) which is a relational equation corresponding to an approximation curve where a minimum film thickness d of an etching stopper film satisfying 80% transmittance in a stacked structure (FIG. 4: d=3.0 (T=80%)) was calculated, and (Condition A) was calculated based on Equation (A).

$$k_2 \leq -0.590 \times n_2^2 + 0.148 \times n_2 + 0.404 \qquad \text{(Condition A)}$$

The equality in (Condition A) corresponds to Equation (A). In the case where a refractive index $n_2$ and the extinction coefficient $k_2$ of an etching stopper film satisfy (Condition A), the condition of 80% or more transmittance can be satisfied when a minimum film thickness d is 3 nm.

By no means of limitation, the etching stopper film preferably has a refractive index $n_2$ of 2.5 or more and 3.1 or less to a light of 193 nm wavelength, and an extinction coefficient $k_2$ of 0.2 or more and 0.4 or less to a light of 193 nm wavelength.

Each configuration of the mask blank of the alternative embodiment is common with the mask blank 100 of the aforementioned first embodiment, except for the etching stopper film 2 being configured from a material satisfying the aforementioned (Condition A).

EXAMPLES

The embodiment of this disclosure is described in greater detail below together with examples.

Example 1

[Manufacture of Mask Blank]

A transparent substrate 1 being composed of a synthetic quartz glass with a size of a main surface of about 152 mm×about 152 mm and a thickness of about 6.35 mm was prepared. An end surface and the main surface of the transparent substrate 1 were polished to a predetermined surface roughness or less (0.2 nm or less root mean square roughness Rq), and thereafter subjected to predetermined cleaning treatment and drying treatment. Each optical characteristic of the transparent substrate 1 was measured using a spectroscopic ellipsometer (M-2000D manufactured by J.A. Woollam), and a refractive index $n_3$ was 1.556 and an extinction coefficient $k_3$ was 0.00 (lower measurement limit) to a light of 193 nm wavelength.

Next, an etching stopper film 2 being composed of hafnium and oxygen (HfO film) was formed in contact with a surface of the transparent substrate 1 at a thickness of 3.3 nm. Concretely, the etching stopper film 2 was formed by placing the transparent substrate 1 in a single-wafer RF sputtering apparatus, discharging a Hf target, and by sputtering (RF sputtering) using mixed gas of argon (Ar) and oxygen ($O_2$) as sputtering gas.

Further, each optical characteristic of the etching stopper film 2 was measured using the spectroscopic ellipsometer (M-2000D manufactured by J.A. Woollam), and a refractive index $n_2$ was 2.84 and an extinction coefficient $k_2$ was 0.31 in a light of 193 nm wavelength. The refractive index $n_2$ and the extinction coefficient $k_2$ of the etching stopper film satisfy the aforementioned (Condition 2). Further, the refractive index $n_2$ and the extinction coefficient $k_2$ of the etching stopper film 2 satisfy the aforementioned (Condition A).

Next, a phase shift film 3 being composed of $SiO_2$ containing silicon and oxygen was formed in contact with a surface of the etching stopper film 2 at a thickness of 177 nm. Concretely, the transparent substrate 1 having the etching stopper film 2 formed thereon was placed in a single-wafer RF sputtering apparatus, and by RF sputtering using a silicon dioxide ($SiO_2$) target and argon (Ar) gas as sputtering gas, the phase shift film being composed of $SiO_2$ was formed on the etching stopper film 2. Incidentally, on a main surface of another transparent substrate 1, only a phase shift film being composed of $SiO_2$ was formed under the same condition, optical characteristics of the uppermost layer were measured using the spectroscopic ellipsometer, and a refractive index $n_1$ was 1.56 and an extinction coefficient $k_1$ was 0.00 (lower measurement limit) in a light of 193 nm wavelength.

Thereafter, a light shielding film 4 containing chromium was formed in contact with a surface of the phase shift film 3 at a thickness of 59 nm. The light shielding film 4 is a CrOC film containing oxygen and carbon in addition to chromium. Concretely, the transparent substrate 1 having the phase shift film 3 formed thereon was placed in a single-wafer DC sputtering apparatus, and by reactive sputtering (DC sputtering) using a chromium (Cr) target under a mixed gas atmosphere of carbon dioxide ($CO_2$) and helium (He), a light shielding film 4 was formed. Next, the transparent substrate 1 having the light shielding film 4 (CrOC film) formed thereon was subjected to heat treatment. Concretely, the heat treatment was carried out using a hot plate at a heating temperature of 280° C. in the atmosphere for five minutes.

The light shielding film 4 after the heat treatment was analyzed by X-ray photoelectron spectroscopy (ESCA with RBS correction). As a result, it was confirmed that the region near the surface that is opposite to the transparent substrate 1 side of the light shielding film (region up to about 2 nm depth from the surface) has a composition gradient portion having more oxygen content than other regions (40 atom % or more oxygen content). Further, content of each constituent element in the region of the light shielding film 4 excluding the composition gradient portion was found to be, at an average value, Cr: 71 atom %, O: 15 atom %, and C: 14 atom %. Moreover, it was confirmed that each difference of each constituent element in thickness direction of the region of the light shielding film 4 excluding the composition gradient portion is 3 atom % or less, and there is substantially no composition gradient in thickness direction. Incidentally, the compositions of other films shown below were also obtained by X-ray photoelectron spectroscopy (ESCA with RBS correction) similar to the light shielding film 4.

A spectrophotometer (Cary4000 manufactured by Agilent Technologies) was used on the light shielding film 4 after the heat treatment to measure an optical density (OD) to an ArF excimer laser light wavelength (about 193 nm), confirming the value of 3.0 or more.

Next, a hard mask film 5 being composed of $SiO_2$ containing silicon and oxygen was formed in contact with a surface of the light shielding film 4 at a thickness of 12 nm. Concretely, the transparent substrate 1 having the light shielding film 4 formed thereon was placed in a single-wafer RF sputtering apparatus, and by RF sputtering using silicon dioxide ($SiO_2$) target and argon (Ar) gas as sputtering gas, a hard mask film 5 being composed of $SiO_2$ was formed on the light shielding film 4. A mask blank 100 of Example 1 was manufactured through the above procedure.

Incidentally, an etching stopper film was formed on another transparent substrate through the same procedure, and a transmittance in a light of 193 nm wavelength with the etching stopper film alone was measured by the spectroscopic ellipsometer. As a result, a transmittance was 75.0% when a transmittance of the transparent substrate is 100%.

Subsequently, a phase shift film was formed in contact with a surface of the etching stopper film through the same procedure, and a transmittance in a light of 193 nm wavelength of a stacked structure of the etching stopper film and the phase shift film was measured by the spectroscopic ellipsometer. As a result, a transmittance was 80.1% when a transmittance of the transparent substrate is 100%.

It was found from this result that the etching stopper film 2 of Example 1 has a transmittance of 80.1% in a stacked structure with the phase shift film 3, which is 80% or more. On the other hand, a transmittance of a stacked structure of the etching stopper film 2 and the phase shift film 3 and a transmittance of the etching stopper film 2 alone had a transmittance difference of 5.1%, which is 5% or more. It can be considered that a desired fine pattern can be made, when the phase shift mask 200 was manufactured from the mask blank 100 of Example 1.

[Manufacture and Evaluation of Phase Shift Mask]

Next, a phase shift mask 200 of Example 1 was manufactured through the following procedure using the mask blank 100 of Example 1. First, a surface of a hard mask film 5 was subjected to HMDS treatment. Subsequently, a resist film of a chemically amplified resist for electron beam writing was formed in contact with a surface of the hard mask film 5 by spin coating at a film thickness of 80 nm. Next, a pattern to be formed in the phase shift film 3 was written on the resist film by an electron beam, and a predetermined development treatment was conducted to thereby form a first resist pattern 6a (see FIG. 3(a)).

Next, dry etching using $CF_4$ gas was conducted with the first resist pattern 6a as a mask, and a hard mask pattern 5a was formed in the hard mask film 5 (see FIG. 3(b)).

Next, the remaining first resist pattern 6a was removed by TMAH. Subsequently, dry etching was conducted under a high bias condition using mixed gas of chlorine and oxygen (gas flow ratio $Cl_2:O_2=20:1$) with the hard mask pattern 5a as a mask, and a light shielding pattern 4a was formed in the light shielding film 4 (see FIG. 3(c)).

Figure 3D:
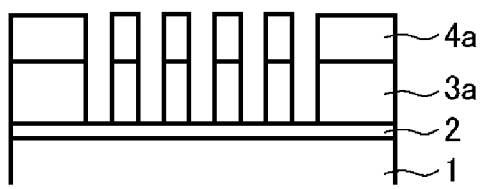

Subsequently, dry etching was conducted using $CF_4$ gas with the light shielding pattern 4a as a mask, and a phase shift pattern 3a was formed in the phase shift film 3 (see FIG. 3(d)). At the initial stage of this etching, the hard mask pattern 5a formed on the light shielding pattern 4a also functioned as an etching mask. However, since the material of the hard mask film 5 and the material of the phase shift film 3 are similarly $SiO_2$, the hard mask pattern 5a was removed at an early stage.

Next, a resist film of a chemically amplified resist for electron beam writing was formed in contact with a surface of the light shielding pattern 4a by spin coating at a film thickness of 200 nm. Next, a pattern to be formed in the light shielding film 4 was written on the resist film by an electron beam, and a predetermined development treatment was conducted to thereby form a second resist pattern 7b (see FIG. 3(e)). Subsequently, dry etching was conducted using mixed gas of chlorine and oxygen (gas flow ratio $Cl_2:O_2=4:1$) with the second resist pattern 7b as a mask, and a light shielding pattern 4b was formed in the light shielding film 4 (see FIG. 3(f)). Next, the second resist pattern 7b was removed by ashing, subjected to cleaning treatment, and the phase shift mask (CPL mask) 200 of Example 1 was manufactured (see FIG. 3(g)).

On the phase shift mask 200 of Example 1, a simulation of a transfer image was made when an exposure transfer was made on a resist film on a semiconductor device at an exposure light of 193 nm wavelength, using AIMS193 (manufactured by Carl Zeiss). The simulated exposure transfer image was inspected, and the design specification was fully satisfied. There was little influence on the exposure transfer caused by the reduction of transmittance of the transparent portion by providing the etching stopper film 2. It can be considered from this result that a circuit pattern to be finally formed on the semiconductor device can be formed at a high precision, even if the phase shift mask 200 of Example 1 was set on a mask stage of an exposure apparatus and a resist film on the semiconductor device was subjected to exposure transfer.

Example 2

[Manufacture of Mask Blank]

A mask blank 100 of Example 2 was manufactured through the same procedure as the mask blank 100 of Example 1, except for the configuration of the etching stopper film 2. Concretely, in the mask blank 100 of Example 2, the etching stopper film 2 was made from a material having a refractive index $n_2$ of 2.70 and an extinction coefficient $k_2$ of 0.25 in a light of 193 nm wavelength, with a film thickness of 4 nm. Thus, the etching stopper film 2 satisfies both aforementioned (Condition 3) and (Condition 4). Further, the refractive index $n_2$ and the extinction coefficient $k_2$ of the etching stopper film 2 satisfy the aforementioned (Condition A). The structure of the mask blank 100 having the etching stopper film 2, the phase shift film 3, and the light shielding film 4 stacked in this order on the transparent substrate 1, and the materials and manufacturing methods of the transparent substrate 1, the phase shift film 3, and the light shielding film 4 are the same as those of Example 1.

A transmittance of the etching stopper film 2 of Example 2 alone in a light of 193 nm wavelength was measured in the same manner as in Example 1, and the transmittance was 75.2% when a transmittance of the transparent substrate 1 is 100%. Further, a transmittance of a stacked state of the etching stopper film 2 and the phase shift film 3 in a light of 193 nm wavelength was measured, and it was found that the transmittance was 80.4% when a transmittance of the transparent substrate 1 is 100%, which is 80% or more. From this result, it was found that the influence of reduction in transmittance caused by providing the etching stopper film 2 of Example 2 is small. On the other hand, a transmittance of a stacked structure of the etching stopper film 2 and the phase shift film 3 and a transmittance of the etching stopper film 2 alone had a transmittance difference of 5.2%, which is 5% or more. It can be considered that a desired fine pattern can be made, when the phase shift mask 200 was manufactured from the mask blank 100 of Example 2.

[Manufacture and Evaluation of Phase Shift Mask]

Next, a phase shift mask 200 of Example 2 was manufactured using the mask blank 100 of Example 2 through the same procedure as Example 1.

On the phase shift mask 200 of Example 2, a simulation of a transfer image was made when an exposure transfer was made on a resist film on a semiconductor device at an exposure light of 193 nm wavelength, using AIMS193 (manufactured by Carl Zeiss). The simulated exposure transfer image was inspected, and the design specification was fully satisfied. There was little influence on the exposure transfer caused by the reduction of transmittance of the transparent portion by providing the etching stopper film 2. It can be considered from this result that a circuit pattern to be finally formed on the semiconductor device can be formed at a high precision, even if the phase shift mask 200 of Example 2 was set on a mask stage of an exposure apparatus and a resist film on the semiconductor device was subjected to exposure transfer.

Comparative Example 1

[Manufacture of Mask Blank]

The mask blank of Comparative Example 1 was manufactured through the same procedure as the mask blank 100 of Example 1, except for the configuration of the etching stopper film. Concretely, in the mask blank of Comparative Example 1, the etching stopper film was made from a material having a refractive index $n_2$ of 2.60 and an extinction coefficient $k_2$ of 0.40 in a light of 193 nm wavelength, with a film thickness of 2.5 nm. Therefore, the etching stopper film 2 does not satisfy any of the aforementioned (Condition 1) to (Condition 8). Further, the etching stopper film does not satisfy the aforementioned (Condition A). The structure of the mask blank having the etching stopper film, the phase shift film, and the light shielding film stacked in this order on the transparent substrate, and the materials and manufacturing methods of the transparent substrate, the phase shift film, and the light shielding film are the same as those of Example 1.

A transmittance of the etching stopper film of Comparative Example 1 alone in a light of 193 nm wavelength was measured in the same manner as in Example 1, and the transmittance was 78.5% when a transmittance of the transparent substrate is 100%. Further, a transmittance of a stacked state of the etching stopper film and the phase shift film in a light of 193 nm wavelength was measured, and the transmittance was 81.7% when a transmittance of the transparent substrate is 100%. On the other hand, a transmittance of a stacked structure of the etching stopper film and the phase shift film and a transmittance of the etching stopper film alone had a transmittance difference of 3.2%, which is less than 5%. It can be considered from the above that a desired fine pattern is difficult to be made, when a phase shift mask was manufactured from the mask blank of Comparative Example 1.

[Manufacture and Evaluation of Phase Shift Mask]

Next, using the mask blank of Comparative Example 1, a phase shift mask of Comparative Example 1 was manufactured through the same procedure as Example 1.

On the phase shift mask of Comparative Example 1, a simulation of a transfer image was made when an exposure transfer was made on a resist film on a semiconductor device at an exposure light of 193 nm wavelength, using AIMS193 (manufactured by Carl Zeiss). The simulated exposure transfer image was inspected, and the design specification was not fully satisfied. It can be understood from this result that when the phase shift mask of Comparative Example 1 was set on a mask stage of an exposure apparatus and exposure-transferred on a resist film on a semiconductor device, frequent generation of short-circuit or disconnection is expected on a circuit pattern to be finally formed on the semiconductor device.

DESCRIPTION OF REFERENCE NUMERALS

1. transparent substrate
2. etching stopper film 3. phase shift film
3a. phase shift pattern
4. light shielding film
4a, 4b light shielding pattern
5. hard mask film
5a. hard mask pattern
6a. resist pattern
7b. resist pattern
100. mask blank
200. phase shift mask
101. pattern forming region
102. light shielding band forming region

The invention claimed is:

1. A mask blank, comprising:
a transparent substrate,
an etching stopper film provided on the transparent substrate, and
a phase shift film provided on the etching stopper film and containing silicon and oxygen,
wherein a refractive index $n_1$ of the phase shift film for light of 193 nm wavelength is 1.5 or more, and
wherein an extinction coefficient $k_1$ of the phase shift film for light of 193 nm wavelength is 0.1 or less, and
wherein a refractive index $n_2$ of the etching stopper film for light of 193 nm wavelength is 2.5 or more and 3.1 or less, and
wherein an extinction coefficient $k_2$ of the etching stopper film for light of 193 nm wavelength film is 0.4 or less, and
wherein the refractive index $n_2$ and the extinction coefficient $k_2$ of the etching stopper film satisfy at least one of (Condition 1) to (Condition 5):

$$[k_2 \leq (1.333 \times n_2) - 3.564] \text{ AND } [k_2 \leq (-0.200 \times n_2) + 0.998]; \quad \text{(Condition 1)}$$

$$[k_2 \leq (1.212 \times n_2) - 3.073] \text{ AND } [k_2 \leq (-0.174 \times n_2) + 0.841]; \quad \text{(Condition 2)}$$

$$[k_2 \leq (1.143 \times n_2) - 2.783] \text{ AND } [k_2 \leq (-0.194 \times n_2) + 0.839]; \quad \text{(Condition 3)}$$

$$[k_2 \leq (1.070 \times n_2) - 2.520] \text{ AND } [k_2 \leq (-0.182 \times n_2) + 0.755]; \quad \text{(Condition 4)}$$

$$[k_2 \leq (0.978 \times n_2) - 2.220] \text{ AND } [k_2 \leq (-0.154 \times n_2) + 0.640]. \quad \text{(Condition 5)}$$

2. A mask blank, comprising:
a transparent substrate,
an etching stopper film provided on the transparent substrate, and
a phase shift film provided on the etching stopper film and containing silicon and oxygen,
wherein a refractive index $n_1$ of the phase shift film for light of 193 nm wavelength is 1.5 or more, and
wherein an extinction coefficient $k_1$ of the phase shift film for light of 193 nm wavelength is 0.1 or less, and
wherein a refractive index $n_2$ of the etching stopper film for light of 193 nm wavelength is 2.5 or more and 3.1 or less, and
wherein an extinction coefficient $k_2$ of the etching stopper film for light of 193 nm wavelength film is 0.4 or less, and
wherein the refractive index $n_2$ and the extinction coefficient $k_2$ of the etching stopper film satisfy at least one of (Condition 1) to (Condition 8):

$$[k_2 \leq (1.333 \times n_2) - 3.564] \text{ AND } [k_2 \leq (-0.200 \times n_2) + 0.998]; \quad \text{(Condition 1)}$$

$$[k_2 \leq (1.212 \times n_2) - 3.073] \text{ AND } [k_2 \leq (-0.174 \times n_2) + 0.841]; \quad \text{(Condition 2)}$$

$$[k_2 \leq (1.143 \times n_2) - 2.783] \text{ AND } [k_2 \leq (-0.194 \times n_2) + 0.839]; \quad \text{(Condition 3)}$$

$$[k_2 \leq (1.070 \times n_2) - 2.520] \text{ AND } [k_2 \leq (-0.182 \times n_2) + 0.755]; \quad \text{(Condition 4)}$$

$$[k_2 \leq (0.978 \times n_2) - 2.220] \text{ AND } [k_2 \leq (-0.154 \times n_2) + 0.640]; \quad \text{(Condition 5)}$$

$$[k_2 \leq (0.899 \times n_2) - 1.964] \text{ AND } [k_2 \leq (-0.138 \times n_2) + 0.569]; \quad \text{(Condition 6)}$$

$$[k_2 \leq (1.133 \times n_2) - 2.462] \text{ AND } [k_2 \leq (-0.186 \times n_2) + 0.657]; \quad \text{(Condition 7)}$$

$$[k_2 \leq (-0.201 \times n_2) + 0.665]. \quad \text{(Condition 8)}$$

3. The mask blank according to claim 1, wherein the extinction coefficient $k_2$ of the etching stopper film is 0.05 or more.

4. The mask blank according to claim 1, wherein the refractive index $n_1$ of the phase shift film is 1.6 or less.

5. The mask blank according to claim 1, wherein a refractive index $n_3$ of the transparent substrate for light of 193 nm wavelength is 1.5 or more and 1.6 or less, and wherein an extinction coefficient $k_3$ of the transparent substrate for light of 193 nm wavelength is 0.1 or less.

6. The mask blank according to claim 1, wherein a stack comprising the etching stopper film and the phase shift film has a transmittance of 80% or more for light of 193 nm wavelength.

7. The mask blank according to claim 1, wherein for light of 193 nm wavelength, a difference between a transmittance (in %) of a stack comprising the etching stopper film and the phase shift film and a transmittance (in %) of the etching stopper film alone is 5% or more.

8. The mask blank according to claim 1, wherein the etching stopper film contains hafnium and oxygen.

9. The mask blank according to claim 1, wherein the etching stopper film is formed in contact with a main surface of the transparent substrate.

10. The mask blank according to claim 1, wherein the etching stopper film has a thickness of 2 nm or more and 10 nm or less.

11. The mask blank according to claim 1, wherein the phase shift film is configured to generate a phase difference of 150 degrees or more and 210 degrees or less between light of 193 nm wavelength transmitted through the phase shift film and light of 193 nm wavelength transmitted through air for a same distance as a thickness of the phase shift film.

12. The mask blank according to claim 1 comprising a light shielding film on the phase shift film.

13. The mask blank according to claim 12, wherein the light shielding film contains chromium.

14. A phase shift mask, comprising:
a transparent substrate,
an etching stopper film provided on the transparent substrate, and
a phase shift film that is provided on the etching stopper film, contains silicon and oxygen, and has a phase shift pattern,
wherein a refractive index $n_1$ of the phase shift film for light of 193 nm wavelength is 1.5 or more, and
wherein an extinction coefficient $k_1$ of the phase shift film for light of 193 nm wavelength is 0.1 or less, and wherein a refractive index $n_2$ of the etching stopper film for light of 193 nm wavelength is 2.5 or more and 3.1 or less, and wherein an extinction coefficient $k_2$ of the etching stopper film for light of 193 nm wavelength film is 0.4 or less, and wherein the refractive index $n_2$ and the extinction coefficient $k_2$ of the etching stopper film satisfy at least one of (Condition 1) to (Condition 5):

$$[k_2 \leq (1.333 \times n_2) - 3.564] \text{ AND } [k_2 \leq (-0.200 \times n_2) + 0.998]; \quad \text{(Condition 1)}$$

$$[k_2 \leq (1.212 \times n_2) - 3.073] \text{ AND } [k_2 \leq (-0.174 \times n_2) + 0.841]; \quad \text{(Condition 2)}$$

$$[k_2 \leq (1.143 \times n_2) - 2.783] \text{ AND } [k_2 \leq (-0.194 \times n_2) + 0.839]; \quad \text{(Condition 3)}$$

$$[k_2 \leq (1.070 \times n_2) - 2.520] \text{ AND } [k_2 \leq (-0.182 \times n_2) + 0.755]; \quad \text{(Condition 4)}$$

$$[k_2 \leq (0.978 \times n_2) - 2.220] \text{ AND } [k_2 \leq (-0.154 \times n_2) + 0.640]. \quad \text{(Condition 5)}$$

15. A phase shift mask, comprising:
a transparent substrate,
an etching stopper film provided on the transparent substrate, and
a phase shift film that is provided on the etching stopper film, contains silicon and oxygen, and has a phase shift pattern,
wherein a refractive index $n_1$ of the phase shift film for light of 193 nm wavelength is 1.5 or more, and
wherein an extinction coefficient $k_1$ of the phase shift film for light of 193 nm wavelength is 0.1 or less, and
wherein a refractive index $n_2$ of the etching stopper film for light of 193 nm wavelength is 2.5 or more and 3.1 or less, and
wherein an extinction coefficient $k_2$ of the etching stopper film for light of 193 nm wavelength film is 0.4 or less, and
wherein the refractive index $n_2$ and the extinction coefficient $k_2$ of the etching stopper film satisfy at least one of (Condition 1) to (Condition 8):

$$[k_2 \leq (1.333 \times n_2) - 3.564] \text{ AND } [k_2 \leq (-0.200 \times n_2) + 0.998]; \quad \text{(Condition 1)}$$

$$[k_2 \leq (1.212 \times n_2) - 3.073] \text{ AND } [k_2 \leq (-0.174 \times n_2) + 0.841]; \quad \text{(Condition 2)}$$

$$[k_2 \leq (1.143 \times n_2) - 2.783] \text{ AND } [k_2 \leq (-0.194 \times n_2) + 0.839]; \quad \text{(Condition 3)}$$

$$[k_2 \leq (1.070 \times n_2) - 2.520] \text{ AND } [k_2 \leq (-0.182 \times n_2) + 0.755]; \quad \text{(Condition 4)}$$

$$[k_2 \leq (0.978 \times n_2) - 2.220] \text{ AND } [k_2 \leq (-0.154 \times n_2) + 0.640]; \quad \text{(Condition 5)}$$

$$[k_2 \leq (0.899 \times n_2) - 1.964] \text{ AND } [k_2 \leq (-0.138 \times n_2) + 0.569]; \quad \text{(Condition 6)}$$

$$[k_2 \leq (1.133 \times n_2) - 2.462] \text{ AND } [k_2 \leq (-0.186 \times n_2) + 0.657]; \quad \text{(Condition 7)}$$

$$[k_2 \leq (-0.201 \times n_2) + 0.665]. \quad \text{(Condition 8)}$$

16. The phase shift mask according to claim 14, wherein the extinction coefficient $k_2$ of the etching stopper film is 0.05 or more.

17. The phase shift mask according to claim 14, wherein the refractive index $n_1$ of the phase shift film is 1.6 or less.

18. The phase shift mask according to claim 14, wherein a refractive index $n_3$ of the transparent substrate for light of 193 nm wavelength is 1.5 or more and 1.6 or less, and wherein an extinction coefficient $k_3$ of the transparent substrate for light of 193 nm wavelength is 0.1 or less.

19. The phase shift mask according to claim 14, wherein a stack comprising the etching stopper film and the phase shift film has a transmittance of 80% or more for light of 193 nm wavelength.

20. The phase shift mask according to claim 14, wherein for light of 193 nm wavelength, a difference between a transmittance (in %) of a stack comprising the etching stopper film and the phase shift film and a transmittance (in %) of the etching stopper film alone is 5% or more.

21. The phase shift mask according to claim 14, wherein the etching stopper film contains hafnium and oxygen.

22. The phase shift mask according to claim 14, wherein the etching stopper film is formed in contact with a main surface of the transparent substrate.

23. The phase shift mask according to claim 14, wherein the etching stopper film has a thickness of 2 nm or more and 10 nm or less.

24. The phase shift mask according to claim 14, wherein the phase shift film is configured to generate a phase difference of 150 degrees or more and 210 degrees or less between light of 193 nm wavelength transmitted through the phase shift film and light of 193 nm wavelength transmitted through air for a same distance as a thickness of the phase shift film.

25. The phase shift mask according to claim 14 comprising a light shielding film having a light shielding pattern with a light shielding band on the phase shift film.

26. The phase shift mask according to claim 25, wherein the light shielding film contains chromium.

27. A method of manufacturing a semiconductor device comprising exposure-transferring a pattern on the phase shift mask according to claim 14 to a resist film on a semiconductor substrate.

28. The mask blank according to claim 2, wherein the extinction coefficient $k_2$ of the etching stopper film is 0.05 or more.

29. The mask blank according to claim 2, wherein the refractive index $n_1$ of the phase shift film is 1.6 or less.

30. The mask blank according to claim 2, wherein a refractive index $n_3$ of the transparent substrate for light of 193 nm wavelength is 1.5 or more and 1.6 or less, and wherein an extinction coefficient $k_3$ of the transparent substrate for light of 193 nm wavelength is 0.1 or less.

31. The mask blank according to claim 2, wherein a stack comprising the etching stopper film and the phase shift film has a transmittance of 80% or more for light of 193 nm wavelength.

32. The mask blank according to claim 2, wherein for light of 193 nm wavelength, a difference between a transmittance (in %) of a stack comprising the etching stopper film and the phase shift film and a transmittance (in %) of the etching stopper film alone is 5% or more.

33. The mask blank according to claim 2, wherein the etching stopper film contains hafnium and oxygen.

34. The mask blank according to claim 2, wherein the etching stopper film is formed in contact with a main surface of the transparent substrate.

35. The mask blank according to claim 2, wherein the etching stopper film has a thickness of 2 nm or more and 10 nm or less.

36. The mask blank according to claim 2, wherein the phase shift film is configured to generate a phase difference of 150 degrees or more and 210 degrees or less between light of 193 nm wavelength transmitted through the phase shift film and light of 193 nm wavelength transmitted through air for a same distance as a thickness of the phase shift film.

37. The mask blank according to claim 2 comprising a light shielding film on the phase shift film.

38. The mask blank according to claim 37, wherein the light shielding film contains chromium.

39. The phase shift mask according to claim 15, wherein the extinction coefficient $k_2$ of the etching stopper film is 0.05 or more.

40. The phase shift mask according to claim 15, wherein the refractive index $n_1$ of the phase shift film is 1.6 or less.

41. The phase shift mask according to claim 15, wherein a refractive index $n_3$ of the transparent substrate for light of 193 nm wavelength is 1.5 or more and 1.6 or less, and wherein an extinction coefficient $k_3$ of the transparent substrate for light of 193 nm wavelength is 0.1 or less.

42. The phase shift mask according to claim 15, wherein a stack comprising the etching stopper film and the phase shift film has a transmittance of 80% or more for light of 193 nm wavelength.

43. The phase shift mask according to claim 15, wherein for light of 193 nm wavelength, a difference between a transmittance (in %) of a stack comprising the etching stopper film and the phase shift film and a transmittance (in %) of the etching stopper film alone is 5% or more.

44. The phase shift mask according to claim 15, wherein the etching stopper film contains hafnium and oxygen.

45. The phase shift mask according to claim 15, wherein the etching stopper film is formed in contact with a main surface of the transparent substrate.

46. The phase shift mask according to claim 15, wherein the etching stopper film has a thickness of 2 nm or more and 10 nm or less.

47. The phase shift mask according to claim 15, wherein the phase shift film is configured to generate a phase difference of 150 degrees or more and 210 degrees or less between light of 193 nm wavelength transmitted through the phase shift film and light of 193 nm wavelength transmitted through air for a same distance as a thickness of the phase shift film.

48. The phase shift mask according to claim 15 comprising a light shielding film having a light shielding pattern with a light shielding band on the phase shift film.

49. The phase shift mask according to claim 48, wherein the light shielding film contains chromium.

50. A method of manufacturing a semiconductor device comprising exposure-transferring a pattern on the phase shift mask according to claim 15 to a resist film on a semiconductor substrate.

* * * * *